United States Patent
Mennenga et al.

(10) Patent No.: US 11,508,756 B2
(45) Date of Patent: Nov. 22, 2022

(54) MEMORY CELL ARRANGEMENT AND METHODS THEREOF

(71) Applicant: Ferroelectric Memory GmbH, Dresden (DE)

(72) Inventors: Menno Mennenga, Dresden (DE); Johannes Ocker, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 0 days.

(21) Appl. No.: 17/356,953

(22) Filed: Jun. 24, 2021

(65) Prior Publication Data

US 2022/0020776 A1    Jan. 20, 2022

Related U.S. Application Data

(63) Continuation of application No. 16/929,660, filed on Jul. 15, 2020, now Pat. No. 11,101,291.

(51) Int. Cl.
*H01L 27/11* (2006.01)
*G11C 11/22* (2006.01)
(Continued)

(52) U.S. Cl.
CPC ...... *H01L 27/11597* (2013.01); *G11C 11/221* (2013.01); *G11C 11/2255* (2013.01);
(Continued)

(58) Field of Classification Search
USPC ...................................................... 365/149
See application file for complete search history.

(56) References Cited

U.S. PATENT DOCUMENTS 5,383,152 A * 1/1995 Miyake ............. H01L 27/10817
365/182
5,748,521 A * 5/1998 Lee ................... H01L 27/10852
257/296

(Continued)

OTHER PUBLICATIONS

Li et al., "Selector-free Hafnium-Zirconium Oxide Ferroelectric Memory and Application in NVSRAM", 2018 IEEE International Electron Devices Meeting (IEDM). Dated Aug. 3, 2018, 4 pages.

(Continued)

*Primary Examiner* — Tan T. Nguyen
(74) *Attorney, Agent, or Firm* — Hickman Becker Bingham Ledesma LLP; Malgorzata A. Kulczycka

(57) ABSTRACT

A memory cell arrangement is provided that may include: a plurality of electrode layers, wherein each of the plurality of electrode layers comprises a plurality of through holes, each of the plurality of through holes extending from a first surface to a second surface of a respective electrode layer; a plurality of electrode pillars, wherein each of the plurality of electrode pillars comprises a plurality of electrode portions, wherein each of the plurality of electrode portions is disposed within a corresponding one of the plurality of through holes; wherein the respective electrode layer and a respective electrode portion of the plurality of electrode portions form a first electrode and a second electrode of a capacitor and wherein at least one memory material portion is disposed in each of the plurality of through holes in a gap between the respective electrode layer and the respective electrode portion.

19 Claims, 16 Drawing Sheets

(51) Int. Cl.
  *H01L 27/11597*  (2017.01)
  *H01L 27/11587*  (2017.01)
  *H01L 27/11504*  (2017.01)
  *H01L 27/11514*  (2017.01)

(52) U.S. Cl.
  CPC .... *G11C 11/2257* (2013.01); *H01L 27/11504* (2013.01); *H01L 27/11514* (2013.01); *H01L 27/11587* (2013.01)

(56) References Cited

U.S. PATENT DOCUMENTS

| | | | |
|---|---|---|---|
| 6,982,453 | B2 | 1/2006 | Kanaya |
| 8,829,646 | B2 | 9/2014 | Lung |
| 10,262,730 | B1 | 4/2019 | Nardi et al. |
| 11,101,291 | B2 * | 8/2021 | Mennenga ........ H01L 27/11504 |
| 2002/0089871 | A1 | 7/2002 | Jeon |
| 2009/0034162 | A1 | 2/2009 | Yawata |
| 2011/0278527 | A1 | 11/2011 | Ishibashi |
| 2012/0032249 | A1 * | 2/2012 | Matsuda ............ H01L 29/7926 438/479 |
| 2013/0032874 | A1 | 2/2013 | Ko |
| 2014/0198553 | A1 | 7/2014 | Lung |
| 2015/0261437 | A1 | 9/2015 | Lee et al. |
| 2017/0352671 | A1 | 12/2017 | Kato |
| 2019/0088871 | A1 | 3/2019 | Kim et al. |
| 2019/0221612 | A1 | 7/2019 | Kim et al. |
| 2019/0393167 | A1 * | 12/2019 | Bedeschi ............ G11C 11/2253 |
| 2020/0194431 | A1 | 6/2020 | Castro et al. |
| 2020/0235050 | A1 | 7/2020 | Lee |
| 2021/0082958 | A1 | 3/2021 | Mennenga |
| 2021/0090662 | A1 | 3/2021 | Mennenga |
| 2021/0091097 | A1 | 3/2021 | Mennenga |
| 2022/0199166 | A1 | 6/2022 | Mennenga et al. |

OTHER PUBLICATIONS

Hou et all, "Investigation for the Feasibility of High-Mobility Channel in 3D NAND Memory", ECS Journal of Solid State Science and Technology, dated 2018, 6 pages.

Buck, Dudley, "Ferroelectrics for Digital Information Storage and Switching", Digital Computer Laboratory Massachusetts Institute of Technology, dated Jun. 5, 1952, 72 pages.

Mennenga, U.S. Appl. No. 16/929,685, filed Jul. 15, 2020, Restriction Requirement, dated Sep. 16, 2021.

Mennenga, U.S. Appl. No. 16/929,685, filed Jul. 15, 2020, Non-Final Rejection, dated Nov. 26, 2021.

Mennenga, U.S. Appl. No. 16/929,666, filed Jul. 15, 2020, Restriction Requirement, dated Jun. 11, 2021.

Mennenga, U.S. Appl. No. 16/929,666, filed Jul. 15, 2020, Non-Final Rejection, dated Oct. 5, 2021.

Mennenga, U.S. Appl. No. 16/929,660, filed Jul. 15, 2020, Notice of Allowance, dated Apr. 23, 2021.

Mennenga, U.S. Appl. No. 16/929,660, filed Jul. 15, 2020, Office Action, dated Feb. 19, 2021.

Mennenga, U.S. Appl. No. 16/929,685, filed Jul. 15, 2020, Notice of Allowance and Fees Due, dated Jan. 7, 2022.

Mennenga, U.S. Appl. No. 16/929,666, filed Jul. 15, 2020, Notice of Allowance and Fees Due, dated May 20, 2022.

Mennenga, U.S. Appl. No. 16/929,666, filed Jul. 15, 2020, Final Rejection, dated Mar. 3, 2022.

* cited by examiner

Supplying a voltage to an electrode pillar associated with a memory cell to be operated selected from a plurality of memory cells via an access device corresponding to the electrode pillar, wherein other memory cells of the plurality of memory cells are not to operated

604

Supplying a voltage to an electrode layer associated with the memory cell to be operated

US 11,508,756 B2

MEMORY CELL ARRANGEMENT AND METHODS THEREOF

BENEFIT CLAIM

This application claims the benefit under 35 U.S.C. § 120 as a Continuation of application Ser. No. 16/929,660, filed Jul. 15, 2020, the entire contents of which is hereby incorporated by reference for all purposes as if fully set forth herein. The applicants hereby rescind any disclaimer of claim scope in the parent applications or the prosecution history thereof and advise the USPTO that the claims in this application may be broader than any claim in the parent applications.

TECHNICAL FIELD

Various aspects relate to a memory cell arrangement, and methods thereof, e.g., a method for operating a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 6 shows a schematic flow diagram of a method for operating a memory cell arrangement, according to various aspects;

DESCRIPTION

Figure 1A:
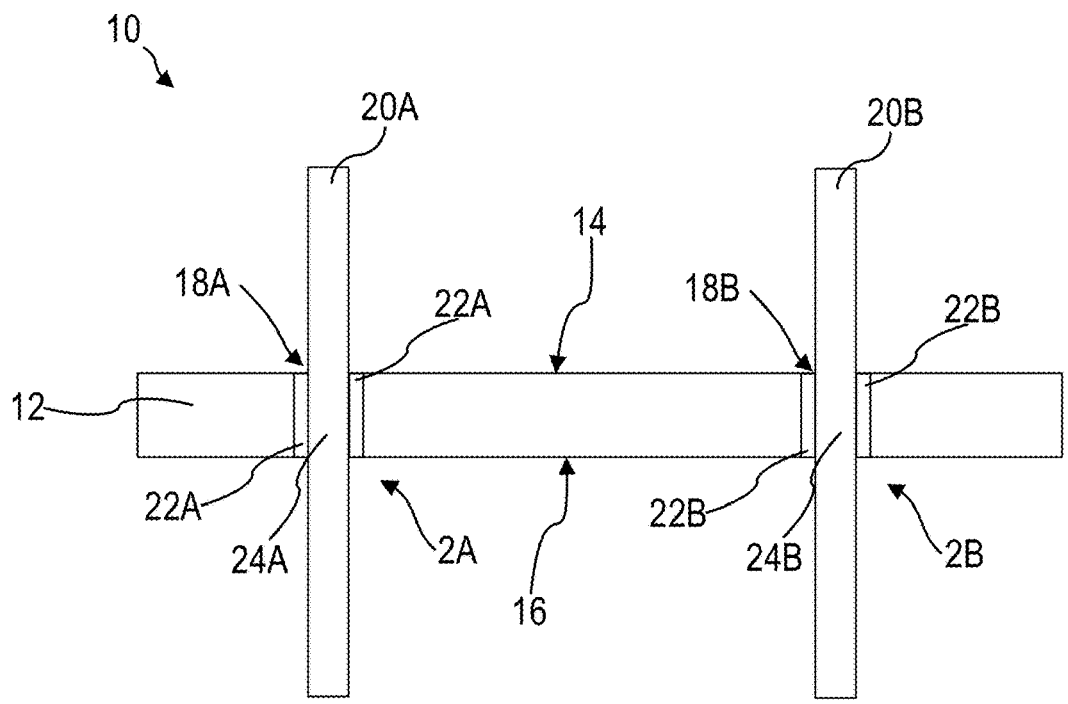
FIGS. 1A, 1B, 2A, and 2B each schematically show a memory cell arrangement, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "voltage" may be used herein with respect to "one or more bitline voltages", "one or more wordline voltages", "one or more plateline voltages", "one or more sourceline voltages", "one or more control line voltages", "one or more base voltages" and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line, e.g., of a memory cell arrangement (for example a "wordline voltage" may be provided to a "wordline", a "bitline voltage" may be provided to a bitline, and a "sourceline voltage" may be provided to a sourceline). The sign of a voltage difference (e.g., a voltage drop) may be defined as a potential inside a memory cell (e.g., at a first electrode portion) minus a potential at a second electrode portion of the memory cell.

Illustratively, a voltage provided to a node or a terminal may assume any suitable value depending on the intended operation of the circuit including the node or terminal. For example, a bitline voltage (referred to as $V_{BL}$ or VBL) may be varied depending on the intended operation of the memory cell arrangement. Analogously, a wordline voltage (referred to as $V_{WL}$ or VWL), a plateline voltage (referred to as $V_{PL}$ or VPL), and/or sourceline voltage (referred to as $V_{SL}$ or VSL) may be varied depending on the intended operation of a memory cell arrangement. A voltage provided to a node or terminal may be defined by the respective potential applied to that node or terminal relative to the base voltage (referred to as Vs) of the circuit. Further, a voltage drop associated with two distinct nodes or terminals of a circuit may be defined by the respective voltages/potentials applied at the two nodes or terminals. As an example, a bitline voltage drop associated with a memory cell of a memory cell arrangement (e.g., an electrode of the memory cell) may be defined by the respective voltages/potentials applied at the corresponding memory cell (e.g., the electrode of the memory cell).

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

According to various aspects, a memory cell may be addressed via a corresponding access device. An access device may include or may be, for example, a field effect transistor (FET), such as an n-type or p-type field-effect transistor, a transmission gate, such as an n-type-based or p-type-based transmission gate, or the like. An access device may have a threshold voltage associated therewith. A threshold voltage of an access device (e.g., a field-effect transistor) may be defined by the properties of the access device (e.g., the field-effect transistor), such as the material(s), the doping(s), etc., and it may thus be a (e.g., intrinsic) property of the access device.

According to various aspects, a memory cell may have at least two distinct states associated therewith, for example with two distinct electrical conductivities that can be determined to evaluate in which of the at least two distinct states the memory cell is residing in. A memory cell in general may include a phase-change or phase-change-based memory cell, a ferroelectric or ferroelectric-based memory cell, a remanent-polarizable memory cell, a capacitor or capacitor-based memory cell, and/or a ferroelectric-capacitor or ferroelectric-capacitor-based memory cell ("FeCAP"). A memory cell may include at least a first memory state and a second memory state. In some aspects, the memory state in which a memory cell is residing in may influence a current characteristic and/or voltage characteristic during readout of the memory cell. The first memory state may be, for example, associated with a logic "1" and the second memory state may be, for example, associated with a logic "0". However, the definition of the memory states and/or the definition of a logic "0" and a logic "1" may be selected arbitrarily.

For example, a phase-change memory cell may include a phase change portion. The phase-change portion may be used to implement memory functions, e.g., in a memory cell. The phase-change portion may include a first phase state and a second phase state. For example, a phase-change memory cell may change from a first phase state to a second phase state or vice versa upon applying an electrical signal and may remain in the respective phase state for at least some time (referred to as retention time).

According to various aspects, a remanent-polarizable memory cell may include a remanently-polarizable portion (also referred to as remanent-polarizable portion). The remanent-polarizable portion may be used to implement memory functions, e.g., in a memory cell. Therefore, according to various aspects, a memory cell may be implemented as a capacitor structure, e.g., as a remanent-polarizable capacitor. In general, a remanent polarization (also referred to as retentivity or remanence) may be present in a material portion (e.g., a material layer) in the case that the material may remain polarized upon reduction of an applied electric field, E, to zero; therefore, a certain value for the electrical polarization, P, of the material portion may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, a remanent-polarizable material may include a spontaneous polarization, for example, with reference to the polarization capability of a material beyond dielectric polarization. The coercivity of a material may be a measure of the strength of the reverse polarizing electric field that may be required to remove a remanent polarization. According to various aspects, an electric coercive field (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The polarization state of the remanent-polarizable portion may be switched by means of a capacitor structure. The polarization state of the remanent-polarizable portion may be read out by means of the capacitor structure. The polarization state of the remanent-polarizable portion may define a memory state, e.g., of a memory cell. As an example, the polarization state of the remanent-polarizable portion may influence one or more electrical characteristics of the capacitor structure, e.g., a charging current during charging the capacitor structure.

In a usual capacitor structure, the amount of charge stored therein may be used to define a memory state (e.g., first amount of charge stored in the capacitor structure may define a first memory state and a second amount of charge stored in the capacitor structure may define a second memory state.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming a remanent-polarizable memory cell may modify the polarization state of the remanent-polarizable memory cell from the first polarization state to the second polarization state (e.g., opposite to the first polarization state). According to various aspects, writing a memory cell may include erasing a memory cell (e.g., performing an erasing operation of a memory cell), wherein the memory state the memory cell is residing in after the erasing may be called "erased state". For example, erasing a remanent-polarizable memory cell may modify the polarization state of the remanent-polarizable memory cell from the second polarization state to the first polarization state. As an example, the programmed state may be associated with a logic "1" and the erased state may be associated with a logic "0". However, the definition of programmed state and erased state may be selected arbitrarily.

The term "switch" may be used herein to describe a modification of the memory state a memory cell is residing in. For example, in the case that a memory cell is residing in a first memory state, the memory state the memory cell is residing in may be switched such that, after the switch, the memory cell may reside in a second memory state, different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable portion. For example, a polarization of a remanent-polarizable portion may be switched, such that the sign of the polarization varies from positive to negative or from negative to positive, while the absolute value of the polarization may remain in some aspects substantially unaltered.

According to various aspects, a ferroelectric-capacitor-based memory cell (also referred to as ferroelectric capacitor—"FeCAP") may include a capacitor structure including a ferroelectric material as a remanent-polarizable portion (e.g., a ferroelectric capacitor). The term "ferroelectric" may be used herein, for example, to describe a material that shows a hysteretic charge voltage relationship (Q-V). The ferroelectric material may be or may include ferroelectric $HfO_2$. Ferroelectric $HfO_2$ may include any form of hafnium oxide that may exhibit ferroelectric properties. This may include, for example, $HfO_2$, $ZrO_2$, a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable portion. According to various aspects, a ferroelectric portion may be an example of a remanent-polarizable portion.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on a memory cell arrangement as described below. The memory cell arrangement may include FeCAP memory cells. Since a ferroelectric material included in a FeCAP memory cell may have at least two stable polarization states, the ferroelectric capacitor may be used as a non-volatile memory cell. Thus, a FeCAP memory cell stores data by means of a ferroelectric material between at least a first electrode and a second electrode of a capacitor structure. According to various aspects, a non-volatile field-effect transistor based memory structure or memory cell may store data for a period of time from hours (e.g., more than 5 hours) to several tens of years (e.g., 10 years, 20 years, etc.), whereas a volatile memory cell may store data for a period of time from nanoseconds to hours (e.g., less than 5 hours).

In comparison to other emerging memory technologies, a remanent-polarizable memory cell, such as a FeCAP based memory cell, may be integrated in the Front-End-of-Line (FEoL) and/or in the Back-End-of-Line (BEoL) process flow, since it may be implemented as a capacitor-type of memory. Accordingly, the integration of the FeCAP based memory cell may comply with a standard FEoL and/or BEoL complementary metal-oxide-semiconductor (CMOS) process flow. Consequently, various integration schemes may be used to integrate a FeCAP based memory cell in different process technologies.

In some aspects, a memory cell arrangement (e.g., an array including a plurality of memory cells) may be operated based on one or more write operations (e.g., program and/or erase operations) and/or one or more readout operations.

During a write operation, as example, predefined voltages may be provided to electrical lines (also referred to as control lines or driver-lines), wherein the electrical lines may be connected to the respective nodes (e.g., respective electrodes) of the memory cells to allow for the desired operation. The electrical lines may be referred to, for example, as bitlines, wordlines, platelines, and/or sourcelines. All memory cells that are not intended to be written may see a voltage that is at least less than the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages.

In general, a memory cell arrangement may include a plurality of (e.g., volatile or non-volatile) memory cells, which may be accessed individually or on groups via a corresponding addressing scheme. The matrix architecture may be, for example, referred to as "NOR" or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more FeCAP memory cells. In some aspects, a control circuit may be configured to carry out and/or instruct one or more write operations associated with a writing of one or more memory cells of the memory cell arrangement. In some aspects, a control circuit may be used to control a writing of a single memory cell of the memory cell arrangement (illustratively, a memory cell that is intended to be written). According to various aspects, writing a memory cell may include bringing the memory cell from one of at least two memory states into another one of the at least two memory states of the memory cell.

According to various aspects, a memory cell arrangement may include an electrode layer including at least a first through hole and a second through hole, each of the first through hole and second through hole extending from a first surface of the electrode layer to a second surface of the electrode layer, wherein the second surface is opposite the first surface; a first electrode pillar, wherein a portion of the first electrode pillar is disposed within the first through hole; a second electrode pillar, wherein a portion of the second electrode pillar is disposed within the second through hole; a first remanent-polarizable portion disposed at least within the first through hole in a first gap between the electrode layer and the portion of the first electrode pillar that is disposed within the first through hole; and a second remanent-polarizable portion disposed at least within the second through hole in a second gap between the electrode layer and the portion of the second electrode pillar that is disposed within the second through hole.

According to various aspects, the electrode layer, the portion of the first electrode pillar, and the first remanent-polarizable portion may form a first memory cell; and the electrode layer, the portion of the second electrode pillar, and the second remanent-polarizable portion may form a second memory cell.

According to various aspects, a memory cell arrangement may include a first electrode layer including a through hole, the through hole extending from a first surface of the first electrode layer to a second surface of the first electrode layer, wherein the second surface is opposite the first surface; a second electrode layer including a through hole, the through hole extending from a first surface of the second electrode layer to a second surface of the second electrode layer, wherein the second surface is opposite the first surface; an electrode pillar, wherein a first portion of the electrode pillar is disposed within the through hole of the first electrode layer and wherein a second portion of the electrode pillar is disposed within the through hole of the second electrode layer; a first remanent-polarizable portion disposed at least within the through hole of the first electrode layer in a gap between the first electrode layer and the first portion of the electrode pillar that is disposed within the through hole of the first electrode layer; and a second remanent-polarizable portion disposed at least within the through hole of the second electrode layer in a gap between the second electrode layer and the second portion of the electrode pillar that is disposed within the through hole of the second electrode layer.

According to various aspects, the first electrode layer, the first portion of the electrode pillar, and the first remanent-polarizable portion may form a first memory cell; and the second electrode layer, the second portion of the electrode pillar, and the second remanent-polarizable portion may form a second memory cell.

According to various aspects, a memory cell arrangement may include a first electrode layer including at least a first through hole and a second through hole, each of the first through hole and second through hole extending from a first surface of the first electrode layer to a second surface of the first electrode layer, wherein the second surface is opposite the first surface; a second electrode layer including at least a first through hole and a second through hole, each of the first through hole and second through hole extending from a first surface of the second electrode layer to a second surface of the second electrode layer, wherein the second surface is opposite the first surface; a first electrode pillar, wherein a first portion of the first electrode pillar is disposed within the first through hole of the first electrode layer and wherein a second portion of the first electrode pillar is disposed within the first through hole of the second electrode layer; a second electrode pillar, wherein a first portion of the second electrode pillar is disposed within the second through hole of the first electrode layer and wherein a second portion of the second electrode pillar is disposed within the second through hole of the second electrode layer; a first remanent-polarizable portion disposed at least within the first through hole of the first electrode layer in a gap between the first electrode layer and the first portion of the first electrode pillar that is disposed within the first through hole of the first electrode layer; a second remanent-polarizable portion disposed at least within the first through hole of the second electrode layer in a gap between the second electrode layer and the second portion of the first electrode pillar that is disposed within the first through hole of the second electrode layer; a third remanent-polarizable portion disposed at least within the second through hole of the first electrode layer in a gap between the first electrode layer and the first portion of the second electrode pillar that is disposed within the second through hole of the first electrode layer; and a fourth remanent-polarizable portion disposed at least within the second through hole of the second electrode layer in a gap between the second electrode layer and the second portion of the second electrode pillar that is disposed within the second through hole of the second electrode layer.

According to various aspects, the first electrode layer, the first portion of the first electrode pillar, and the first remanent-polarizable portion may form a first memory cell; the second electrode layer, the second portion of the first electrode pillar, and the second remanent-polarizable portion may form a second memory cell; the first electrode layer, the first portion of the second electrode pillar, and the third remanent-polarizable portion may form a third memory cell; and/or the second electrode layer, the second portion of the second electrode pillar, and the fourth remanent-polarizable portion may form a fourth memory cell.

According to various aspects, a memory cell arrangement may include one or more electrode layers, wherein each of the one or more electrode layers includes one or more through holes, each through hole of the one or more through holes extending from a first surface of the respective electrode layer to a second surface of the electrode layer, wherein the second surface is opposite the first surface; one or more electrode pillars, wherein each electrode pillar of the one or more electrode pillars includes one or more electrode portions, wherein each of the one or more electrode portions is disposed within a corresponding through hole of the one or more through holes; wherein at least one remanent-polarizable portion is disposed in each through hole of the one or more through holes in a gap between the respective electrode layer and the respective electrode portion.

According to various aspects, for each of the through holes, the corresponding electrode portion, the corresponding electrode layer, and the corresponding remanent-polarizable portion may form a memory cell of one or more memory cells.

According to various aspects, a memory cell arrangement may include a plurality of electrode layers, wherein each of the plurality of electrode layers includes a plurality of through holes, each through hole of the plurality of through holes extending from a first surface of the respective electrode layer to a second surface of the electrode layer, wherein the second surface is opposite the first surface; a plurality of electrode pillars, wherein each electrode pillar of the plurality of electrode pillars includes a plurality of electrode portions, wherein each of the plurality of electrode portions is disposed within a corresponding through hole of the plurality through holes; wherein at least one remanent-polarizable portion is disposed in each through hole of the plurality of through holes in a gap between the respective electrode layer and the respective electrode portion.

According to various aspects, for each of the through holes, the corresponding electrode portion, the corresponding electrode layer, and the corresponding remanent-polarizable portion may form a memory cell of a plurality of memory cells.

According to various aspects, a memory cell arrangement may include a first electrode layer including at least a first through hole, a second through hole, a third through hole, and a fourth through hole, each of the first through hole, the second through hole, the third through hole, and the fourth through hole extending from a first surface of the first electrode layer to a second surface of the first electrode layer, wherein the second surface is opposite the first surface; a second electrode layer including at least a first through hole, a second through hole, a third through hole, and a fourth through hole, each of the first through hole, the second through hole, the third through hole, and the fourth through hole extending from a first surface of the second electrode layer to a second surface of the second electrode layer, wherein the second surface is opposite the first surface; a first electrode pillar, wherein a first portion of the first electrode pillar is disposed within the first through hole of the first electrode layer and wherein a second portion of the first electrode pillar is disposed within the first through hole of the second electrode layer; a second electrode pillar, wherein a first portion of the second electrode pillar is disposed within the second through hole of the first electrode layer and wherein a second portion of the second electrode pillar is disposed within the second through hole of the second electrode layer; a third electrode pillar, wherein a first portion of the third electrode pillar is disposed within the third through hole of the first electrode layer and wherein a second portion of the third electrode pillar is disposed within the third through hole of the second electrode layer; a fourth electrode pillar, wherein a first portion of the fourth electrode pillar is disposed within the fourth through hole of the first electrode layer and wherein a second portion of the fourth electrode pillar is disposed within the fourth through hole of the second electrode layer; a first remanent-polarizable portion disposed at least within the first through hole of the first electrode layer in a gap between the first electrode layer and the first portion of the first electrode pillar that is disposed within the first through hole of the first electrode layer; a second remanent-polarizable portion disposed at least within the first through hole of the second electrode layer in a gap between the second electrode layer and the second portion of the first electrode pillar that is disposed within the first through hole of the second electrode layer; a third remanent-polarizable portion disposed at least within the second through hole of the first electrode layer in a gap between the first electrode layer and the first portion of the second electrode pillar that is disposed within the second through hole of the first electrode layer; a fourth remanent-polarizable portion disposed at least within the second through hole of the second electrode layer in a gap between the second electrode layer and the second portion of the second electrode pillar that is disposed within the second through hole of the second electrode layer; a fifth remanent-polarizable portion disposed at least within the third through hole of the first electrode layer in a gap between the first electrode layer and the first portion of the third electrode pillar that is disposed within the third through hole of the first electrode layer; a sixth remanent-polarizable portion disposed at least within the third through hole of the second electrode layer in a gap between the second electrode layer and the second portion of the third electrode pillar that is disposed within the third through hole of the second electrode layer; a seventh remanent-polarizable portion disposed at least within the fourth through hole of the first electrode layer in a gap between the first electrode layer and the first portion of the fourth electrode pillar that is disposed within the fourth through hole of the first electrode layer; an eighth remanent-polarizable portion disposed at least within the fourth through hole of the second electrode layer in a gap between the second electrode layer and the second portion of the fourth electrode pillar that is disposed within the fourth through hole of the second electrode layer; wherein the first electrode layer, the first portion of the first electrode pillar, and the first remanent-polarizable portion form a first memory cell; wherein the second electrode layer, the second portion of the first electrode pillar, and the second remanent-polarizable portion form a second memory cell; wherein the first electrode layer, the first portion of the second electrode pillar, and the third remanent-polarizable portion form a third memory cell; wherein the second electrode layer, the second portion of the second electrode pillar, and the fourth remanent-polarizable portion form a fourth memory cell; wherein the first electrode layer, the first portion of the third electrode pillar, and the fifth remanent-polarizable portion form a fifth memory cell; wherein the second electrode layer, the second portion of the third electrode pillar, and the sixth remanent-polarizable portion form a sixth memory cell; wherein the first electrode layer, the first portion of the fourth electrode pillar, and the seventh remanent-polarizable portion form a seventh memory cell; wherein the second electrode layer, the second portion of the fourth electrode pillar, and the eighth remanent-polarizable portion form an eighth memory cell; a first access device configured to connect a first bitline to the first electrode pillar controlled by a voltage applied at a first wordline; a second access device configured to connect the first bitline to the second electrode pillar controlled by a voltage applied at a second wordline; a third access device configured to connect a second bitline to the third electrode pillar controlled by a voltage applied at the first wordline; a fourth access device configured to connect the second bitline to the fourth electrode pillar controlled by a voltage applied at the second wordline; and a control circuit configured to address one of the first memory cell, the second memory cell, the third memory cell, the fourth memory cell, the fifth memory cell, the sixth memory cell, the seventh memory cell, or the eighth memory cell by supplying a first voltage to the associated one of the first bitline or the second bitline, a second voltage to the associated one of the first wordline or the second wordline, and a third voltage to the associated one of the first electrode layer or the second electrode layer.

According to various aspects, a method, e.g., a method for operating a memory cell arrangement, may include supplying a voltage to an electrode pillar associated with a memory cell to be addressed selected from a plurality of memory cells via an access device corresponding to the electrode pillar, wherein other memory cells of the plurality of memory cells are not addressed; and supplying a second voltage to an electrode layer associated with the memory cell to be addressed.

According to various aspects, a method, e.g., a method for manufacturing a memory cell arrangement, may include forming an electrode layer stack at least one of over or in a substrate, wherein the electrode layer stack includes at least a first electrode layer, a second electrode layer, and an interlayer disposed between the first electrode layer and the second electrode layer; forming one or more recesses (e.g., one or more holes) into the electrode layer stack, wherein the one or more recesses extend at least through the first electrode layer, the interlayer, and the second electrode layer, partially filling the one or more recesses with a remanent-polarizable material, the remanent-polarizable material at least covering (at least partially or completely) a sidewall of each of the one or more recesses; and, subsequently, at least partially filling a remaining space in each of the one or more recesses with an electrode material, wherein, in each of the one or more recesses, a portion of the remanent-polarizable material is disposed between a portion of the electrode material and one of the electrode layers.

FIG. 1A illustrates schematically a cross-section of an exemplary memory cell arrangement 10 according to various aspects. The memory cell arrangement 10 may include an electrode layer 12. The electrode layer 12 may include at least a first trough hole 18A and a second through hole 18B. The electrode layer 12 may have a first surface 14 and a second surface 16. The second surface 16 may be opposite the first surface 14. The first trough hole 18A may extend from the first surface 14 of the electrode layer 12 to the second surface 16 of the electrode layer 12. The second trough hole 18B may extend from the first surface 14 of the electrode layer 12 to the second surface 16 of the electrode layer 12. The electrode layer 12 may have a plate shape. The electrode layer 12 may include or may consist of a metal or a metal alloy. For example, the electrode layer 12 may include or may consist of Cu, Au, Ag, W, Al, Ru, Ti, TiN, Ta, TaN, Co, CoN, Nb, NbN, Pd, Pt, Ir, $IrO_2$, $RuO_2$, Poly-Si etc.

The memory cell arrangement 10 may include a first electrode pillar 20A. A portion 24A of the first electrode pillar 20A may be disposed within the first through hole 18A of the electrode layer 12. A first memory material portion 22A (e.g., a first remanent-polarizable portion) may be disposed at least within the first through hole 18A in a gap between the electrode layer 12 and the portion 24A of the first electrode pillar 20A that is disposed within the first through hole 18A.

A memory material may include a phase-change material or a remanent-polarizable material, or the like. In the following various aspects will be described for a remanent-polarizable material as a memory material. However, it is noted that any other material that has at least two distinct states associated therewith may be used as a memory material.

The memory cell arrangement 10 may include a second electrode pillar 20B. A portion 24B of the second electrode pillar 20B may be disposed within the second through hole 18B of the electrode layer 12. A second remanent-polarizable portion 22B may be disposed at least within the second through hole 18B in a gap between the electrode layer 12 and the portion 24B of the second electrode pillar 20B that is disposed within the second through hole 18B.

It is noted that the term "a through hole in a layer" may be understood in such a way that the through hole is defined by the particular (e.g., patterned) structure of the layer and that the through hole may or may not be filled with one or more materials. In several aspects, a through hole may be provided in an electrode layer, wherein the through hole is filled at least partially with a material that is different from the material of the electrode layer. The one or more material portions filling the through hole may be part of a memory cell and may form, in conjunction with the electrode layer, a memory cell.

According to various aspects, each electrode pillar 20 (e.g., the first electrode pillar 20A and the second electrode pillar 20B) may have a pillar shape with a base geometry of one of the following: a circle, a square, a triangle, a parallelogram, a trapezoid, an ellipse, a polygon, etc. An electrode pillar 20 may have a short side given by the base geometry and a long side defined by a pillar length or pillar height. A direction of the long side of an electrode pillar 20 may be an axial direction and may deviate from a parallel direction to the electrode layer 12 (e.g., to the first surface 14 of the electrode layer 12). For example, an axial direction of an electrode pillar 20 may be substantially perpendicular to the electrode layer 12 (e.g., parallel to the electrode layer normal). An electrode pillar 20 may include or may consist of a metal or a metal alloy. For example, an electrode pillar 20 may include or may consist of Cu, Au, Ag, W, Al, Ru, Ti, TiN, Ta, TaN, Co, CoN, Nb, NbN, Pd, Pt, Ir, $IrO_2$, $RuO_2$, etc. According to various aspects, an electrode pillar 20 may include or may consist of a degenerated semiconductor (e.g., Poly-Si).

According to various aspects, the electrode layer 12 may be arranged over a substrate. The electrode layer 12 may be arranged substantially parallel to the substrate. The electrode pillars 20 may be arranged substantially perpendicular to a surface of the substrate. According to various aspects, the memory cell arrangement 10 may include a plurality of electrode layers. The size (e.g., the lateral dimension) of two or more electrode layers of the plurality of electrode layers may be different from one another. For example, the lateral dimension of a first electrode layer parallel to the surface of the substrate may be different from the lateral dimension of a second electrode layer parallel to the surface of the substrate.

According to various aspects, each electrode pillar 20 may be physically separated from the electrode layer 12. Each electrode pillar 20 may be electrically isolated from the electrode layer 12. All electrode pillars 20 may be physically separated from one another. All electrode pillars 20 may electrically isolated from one another. For example, each electrode pillar 20 may be physically separated and/or electrically isolated from the electrode layer 12 via the respective gap between the electrode layer 12 and the portion 24 of the respective electrode pillar 20 (e.g., an electrode pillar 20 and the electrode layer 12 may be spaced apart or may be distant from one another). For example, each electrode pillar 20 may be physically separated and/or electrically isolated from the electrode layer 12 via the remanent-polarizable portion 22 between the electrode layer 12 and the portion 24 of the respective electrode pillar 20. According to various aspects, each remanent-polarizable portion 22 (e.g., the first remanent-polarizable portion 22A and the second remanent-polarizable portion 22B) may completely fill the gap between the electrode layer 12 and the respective electrode pillar 20.

According to various aspects, the each remanent-polarizable portion 22 (e.g., the first remanent-polarizable portion 22A and the second remanent-polarizable portion 22B) may be in direct contact with electrode layer 12. Each remanent-polarizable portion 22 may be in direct contact with the associated electrode pillar 20. For example, the first remanent-polarizable portion 22A may be in direct contact with the electrode layer 12 and the first electrode pillar 20A. The electrode layer 12, the first remanent-polarizable portion 22A, and the first electrode pillar 20A may form a tri-layer. For example, the second remanent-polarizable portion 22B may be in direct contact with the electrode layer 12 and the second electrode pillar 20B. The electrode layer 12, the second remanent-polarizable portion 22B, and the second electrode pillar 20B may form a tri-layer.

According to various aspects, each remanent-polarizable portion 22 (e.g., the first remanent-polarizable portion 22A and the second remanent-polarizable portion 22B) may perimeterally surround (e.g., completely perimeterally surround) at least the respective electrode pillar portion 24. For example, the first remanent-polarizable portion 22A may perimeterally surround the portion 24A of the first electrode pillar 20A and the second remanent-polarizable portion 22B may perimeterally surround the portion 24B of the second electrode pillar 20B.

Illustratively, the electrode layer 12 and a portion 24 of an electrode pillar 20 may form a first electrode and a second electrode, respectively, of a capacitor and respective the remanent-polarizable 22 may be disposed between the first electrode and the second electrode of the capacitor.

According to various aspects, the electrode layer 12, the portion 24A of the first electrode pillar 20A, and the first remanent-polarizable portion 22A may form a first memory cell 2A. The electrode layer 12, the portion 24B of the second electrode pillar 20B, and the second remanent-polarizable portion 22B may form a second memory cell 2B.

Each remanent-polarizable portion 22 (e.g., the first remanent-polarizable portion 22A and the second remanent-polarizable portion 22B) may include or may consist of a ferroelectric material, such as ferroelectric hafnium oxide. Each memory cell (e.g., the first memory cell 2A and the second memory cell 2B) may include or may be a remanent-polarizable capacitor-based memory cell, such as a FeCAP.

Figure 1B:
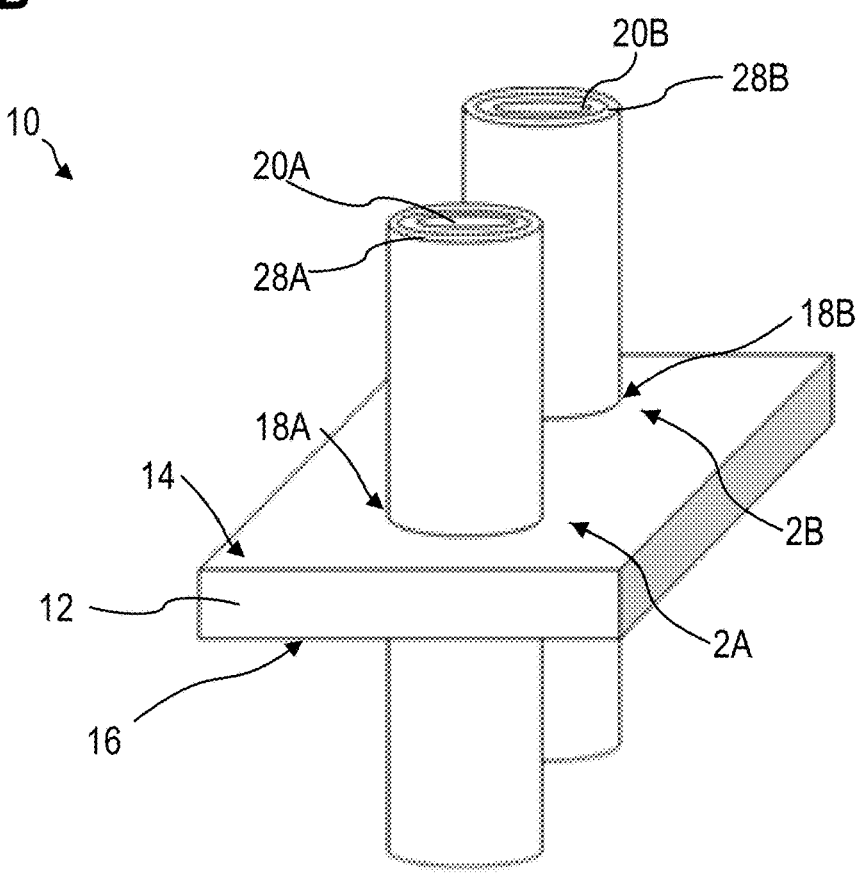

FIG. 1B illustrates schematically a perspective view of an exemplary memory cell arrangement 10 according to various aspects. The memory cell arrangement 10 may correspond substantially to the cross-section shown in FIG. 1A, wherein the first electrode pillar 20A and the second electrode pillar 20B may have a cylindrical shape.

According to various aspects, an electrode pillar 20 may be perimeterally surrounded (e.g., completely perimeterally surrounded) by a remanent-polarizable layer 28. For example, a first remanent-polarizable layer 28A may perimeterally surround the first electrode pillar 20A. For example, a second remanent-polarizable layer 28B may perimeterally surround the second electrode pillar 20B. A remanent-polarizable layer 28 may be a substantially continuous remanent-polarizable layer 28. A remanent-polarizable layer 28 may provide (e.g., may include, e.g., may form) the remanent-polarizable portion 22 associated with the respective electrode pillar 20. For example, the first remanent-polarizable layer 28A may form the first remanent-polarizable portion 22A. For example, the second remanent-polarizable layer 28B may form the second remanent-polarizable portion 22B.

Figure 2A:
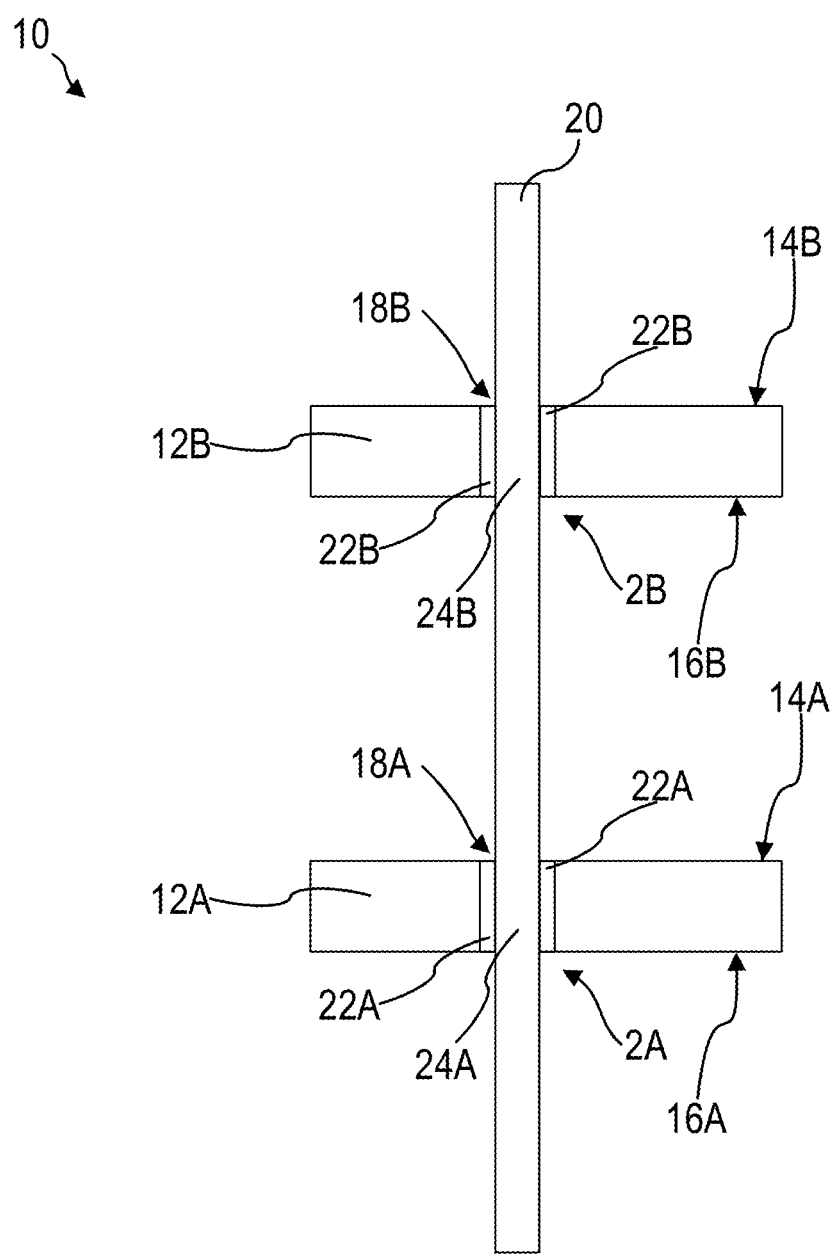

FIG. 2A illustrates schematically a cross-section of an exemplary memory cell arrangement 10 according to various aspects. The memory cell arrangement 10 may include a first electrode layer 12A and a second electrode layer 12B.

The first electrode layer 12A may include at least a trough hole 18A. The first electrode layer 12A may have a first surface 14A and a second surface 16A. The second surface 16A may be opposite the first surface 14A. The trough hole 18A of the first electrode layer 12A may extend from the first surface 14A of the first electrode layer 12A to the second surface 16A of the first electrode layer 12A.

The second electrode layer 12B may include at least a trough hole 18B. The second electrode layer 12B may have a first surface 14B and a second surface 16B. The second surface 16B may be opposite the first surface 14B. The trough hole 18B of the second electrode layer 12B may extend from the first surface 14B of the second electrode layer 12B to the second surface 16B of the second electrode layer 12B.

According to various aspects, the first electrode layer 12A and the second electrode layer 12B may be physically separated from one another. The first electrode layer 12A and the second electrode layer 12B may be electrically isolated from one another. At least one interlayer may be disposed between the first electrode layer 12A and the second electrode layer 12B. The interlayer may be configured to electrically decouple the first electrode layer 12A and the second electrode layer 12B from each other. For example, the interlayer may include an electrically insulating material.

The memory cell arrangement 10 may include an electrode pillar 20. A first portion 24A of the electrode pillar 20 may be disposed within the through hole 18A of the first electrode layer 12A. A second portion 24B of the electrode pillar 20 may be disposed within the through hole 18B of the second electrode layer 12B.

A first remanent-polarizable portion 22A may be disposed at least within the through hole 18A of the first electrode layer 12A in a gap between the first electrode layer 12A and the first portion 24A of the electrode pillar 20 that is disposed within the through hole 18A. A second remanent-polarizable portion 22B may be disposed at least within the through hole 18B of the second electrode layer 12B in a gap between the second electrode layer 12B and the second portion 24B of the electrode pillar 20 that is disposed within the through hole 18B.

According to various aspects, the first electrode layer 12A, the first portion 24A of the electrode pillar 20, and the first remanent-polarizable portion 22A may form a first memory cell 2A. The second electrode layer 12B, the second portion 24B of the electrode pillar 20, and the second remanent-polarizable portion 22B may form a second memory cell 2B.

Figure 2B:
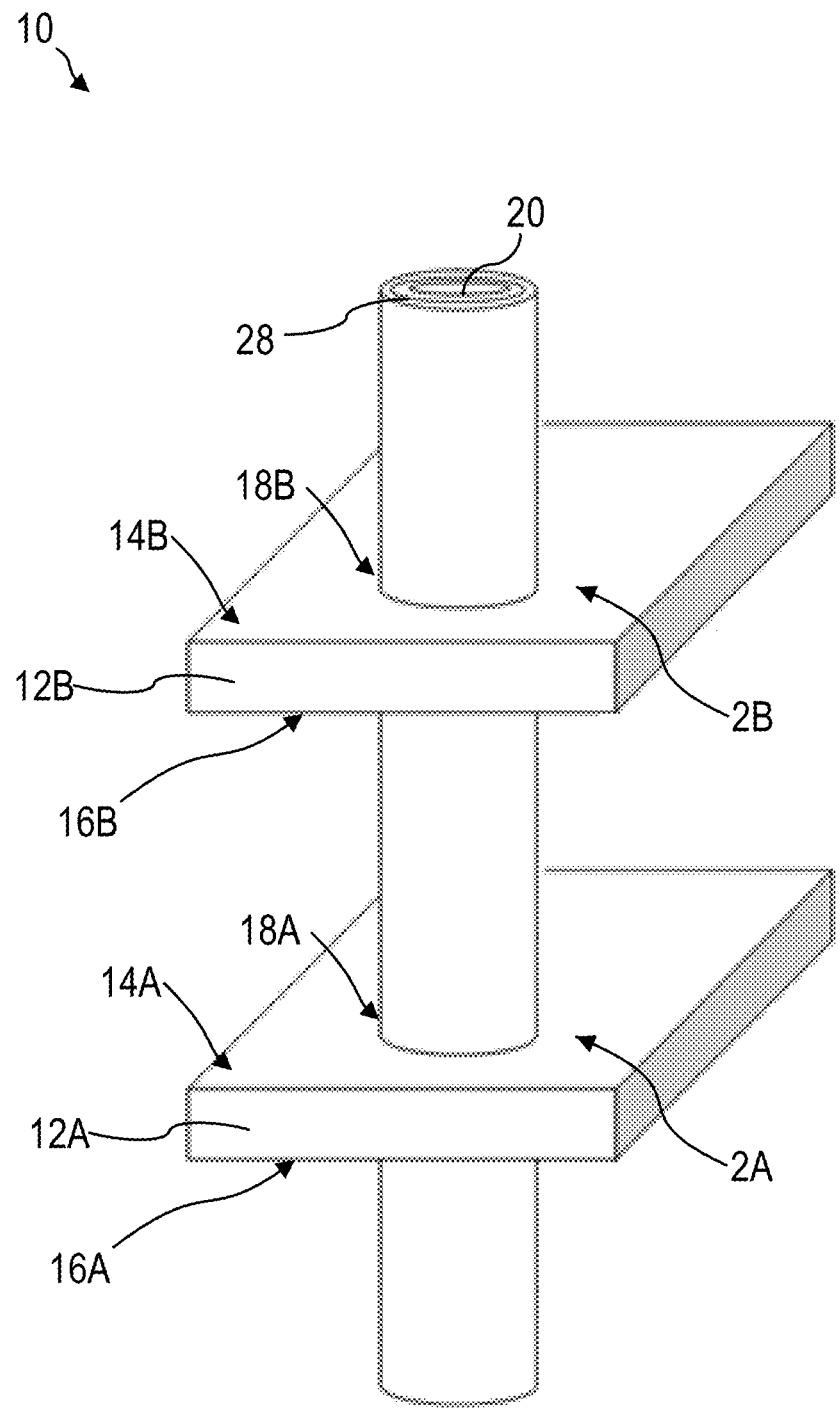

FIG. 2B illustrates schematically a perspective view of an exemplary memory cell arrangement 10 according to various aspects. The memory cell arrangement 10 may correspond substantially to the cross-section shown in FIG. 2A, wherein the electrode pillar 20 may have a cylindrical shape. According to various aspects, the electrode pillar 20 may be perimeterally surrounded (e.g., completely perimeterally surrounded) by a remanent-polarizable layer 28, as described above.

Figure 3A:
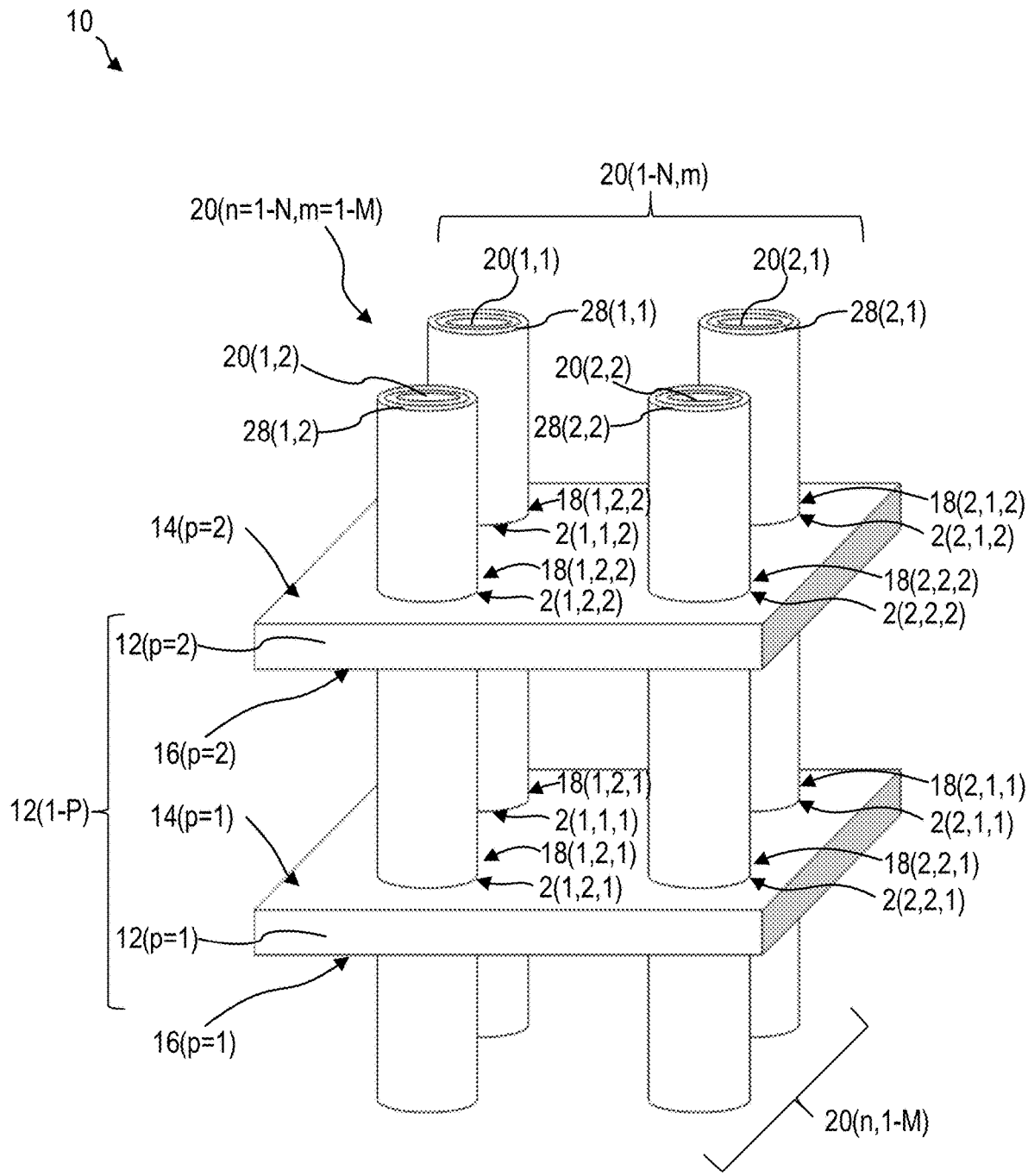
FIG. 3A shows a perspective view of a memory cell arrangement, according to various aspects.

FIG. 3A illustrates schematically a perspective view of an exemplary memory cell arrangement 10, according to various aspects. The memory cell arrangement 10 may include a plurality of electrode layers 12(1-P). The plurality of electrode layers 12(1-P) may include a first number, P, of electrode layers 12(p). Hence, the plurality of electrode layers 12(1-P) may include electrode layers 12(p) from p=1 to p=$p_{max}$, wherein the first number, P, may correspond to $p_{max}$. The first number, P, may be an integer number greater than one (e.g., two or more than two, e.g., greater than one-hundred, e.g., greater than one-thousand, e.g., greater than ten-thousand).

Each electrode layer 12(p) of the plurality of electrode layers 12(1-P) may have a first surface 14(p) and a second surface 16(p), wherein the second surface 16(p) may be opposite the first surface 14(p). Each electrode layer 12(p) of the plurality of electrode layers 12(1-P) may include a plurality of through holes 18(1-N, 1-M, p). The plurality of through holes 18(1-N, 1-M, p) of each electrode layer 12(p) may be arranged in an array configuration, e.g., a matrix architecture. The (two-dimensional) array A(n=1–N, m=1–M) may be defined by a second number, N, and a third number, M. The (two-dimensional) array A(n=1–N, m=1–M) may include N times M space regions. For example, the array (or matrix) A(n=1N, m=1–M) may include N matrix columns and M matrix rows. Hence, the matrix columns may include a plurality of matrix columns from n=1 to n=$n_{max}$, wherein the second number, N, may correspond to $n_{max}$. The second number, N, may be an integer number greater than one (e.g., two or more than two, e.g., greater than one-hundred, e.g., greater than one-thousand, e.g., greater than ten-thousand). The matrix rows may include a plurality of matrix rows from m=1 to m=$m_{max}$, wherein the third number, M, may correspond to $m_{max}$. The third number, M, may be an integer number greater than one (e.g., two or more than two, e.g., greater than one-hundred, e.g., greater than one-thousand, e.g., greater than ten-thousand). According to various aspects, all through holes 18(n, m, p) of the plurality of through holes 18(1-N, 1-M, 1-P) may be arranged in a three-dimensional (e.g., a regular three-dimensional) array configuration.

Each through holes 18(n, m, p) of the plurality of through holes 18(1-N, 1-M, 1-P) may extend from the first surface 14(p) to the second surface 16(p) of the corresponding electrode layer 12(p).

The memory cell arrangement 10 may include a plurality of electrode pillars 20(1-N, 1-M). Each electrode pillar 20(n, m) of the plurality of electrode pillars 20(1-N, 1-M) may include a plurality of electrode pillar portions 24(n, m, 1-P). Each electrode pillar portion 24(n, m, p) of the plurality of electrode pillar portions 24(1-N, 1-M, 1-P) may be disposed within a corresponding through hole 18(n, m, p) of the plurality of through holes 18(1-N, 1-M, 1-P). Each electrode pillar portion 24(n, m, p) of the plurality of electrode pillar portions 24(1-N, 1-M, 1-P) may be disposed within an unambiguously (e.g., bijectively) assigned through hole 18(n, m, p) of the plurality of through holes 18(1-N, 1-M, 1-P). For example, an electrode pillar portion 24(n*, m*, p*) may be disposed within an unambiguously assigned to a through hole 18(n*, m*, p*). In the following, the *-notation may define one specific integer for the corresponding variable, such as a specific n* for the variable n, a specific m* for the variable m, and/or a specific p* for the variable p.

According to various aspects, at least one remanent-polarizable portion 22(n, m, p) may be disposed in each through hole 18(n, m, p) of the plurality of through holes 18(1-N, 1-M, 1-P). The at least one remanent-polarizable portion 22(n, m, p) may be disposed in each through hole 18(n, m, p) of the plurality of through holes 18(1-N, 1-M, 1-P) in a gap between the respective electrode layer 12(p) and the respective electrode pillar portion 24(n, m, p).

According to various aspects, each electrode pillar 20(n, m) of the plurality of electrode pillars 20(1-N, 1-M) may be perimeterally surrounded (e.g., completely perimeterally surrounded) by a respective remanent-polarizable layer 28(n, m). Each remanent-polarizable layer 28(n, m) may be a substantially continuous remanent-polarizable layer 28(n, m). Each remanent-polarizable layer 28(n, m) may provide (e.g., may include, e.g., may form) the remanent-polarizable portions 22(n, m, 1-P) associated with the respective electrode pillar 20(n, m). For example, a remanent-polarizable layer 28(n*, m*) may provide the remanent-polarizable portions 22(n*, m*, 1-P) associated with the electrode pillar 20(n*, m*).

According to various aspects, for each through hole 18(n, m, p) of the plurality of through holes 18(1-N, 1-M, 1-P), the corresponding electrode pillar portion 24(n, m, p), the corresponding electrode layer 12(p), and the corresponding remanent-polarizable portion 22(n, m, p) may form a memory cell 2(n, m, p) of a plurality of memory cells 2(1-N, 1-M, 1-P). Hence, the memory cell arrangement 10 may include the plurality of memory cells 2(1-N, 1-M, 1-P). As described above with respect to the plurality of through holes 18(1-N, 1-M, 1-P), the plurality of memory cells 2(1-N, 1-M, 1-P) may be arranged in a three-dimensional (e.g., a regular three-dimensional) array configuration. The array A(n=1–N, m=1–M, p=1–P) may include N times M times P memory cells. For example, the three-dimensional array A(n=1–N, m=1–M, p=1–P) may include P times the two-dimensional array A(n=1–N, m=1–M). For example, each electrode layer 12(*p*) may include a two-dimensional array A(n=1–N, m=1–M) (e.g., for p=1), and another layer (e.g., positioned above or below, such as directly above or directly below) may include another two-dimensional array A(n=1–N, m=1–M) (e.g., for p=1). See, only as an example, FIG. 5B that shows an array A(n=1-2, m=1-2, p=1-2) of 2×2×2 memory cells.

FIG. 3A exemplarily shows a memory cell arrangement 10 for N=2, M=2, and P=2, i.e., two electrode layers 12(1-2) and an array A(n=1-2, m=1-2) of 2×2 electrode pillars 20(*n, m*). It is understood that other configurations of a memory cell arrangement 10 may be configured in the same or in a similar way for N greater 2, M greater 2, and/or P greater 2, according to various aspects.

Figure 3B:
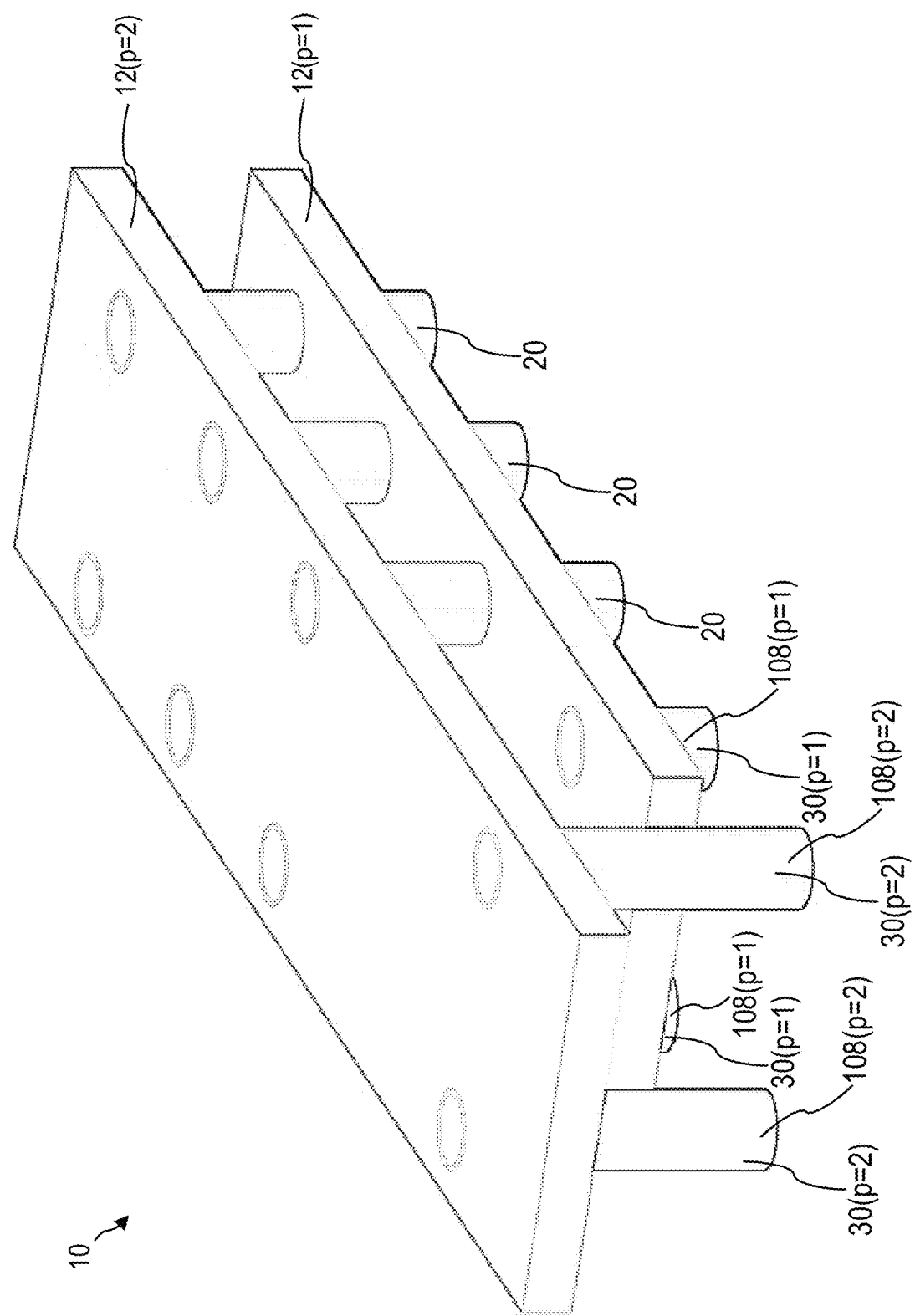
FIGS. 3B and 3C each schematically show an example of contacting electrode layers of a memory cell arrangement, according to various aspects.
Figure 3C:
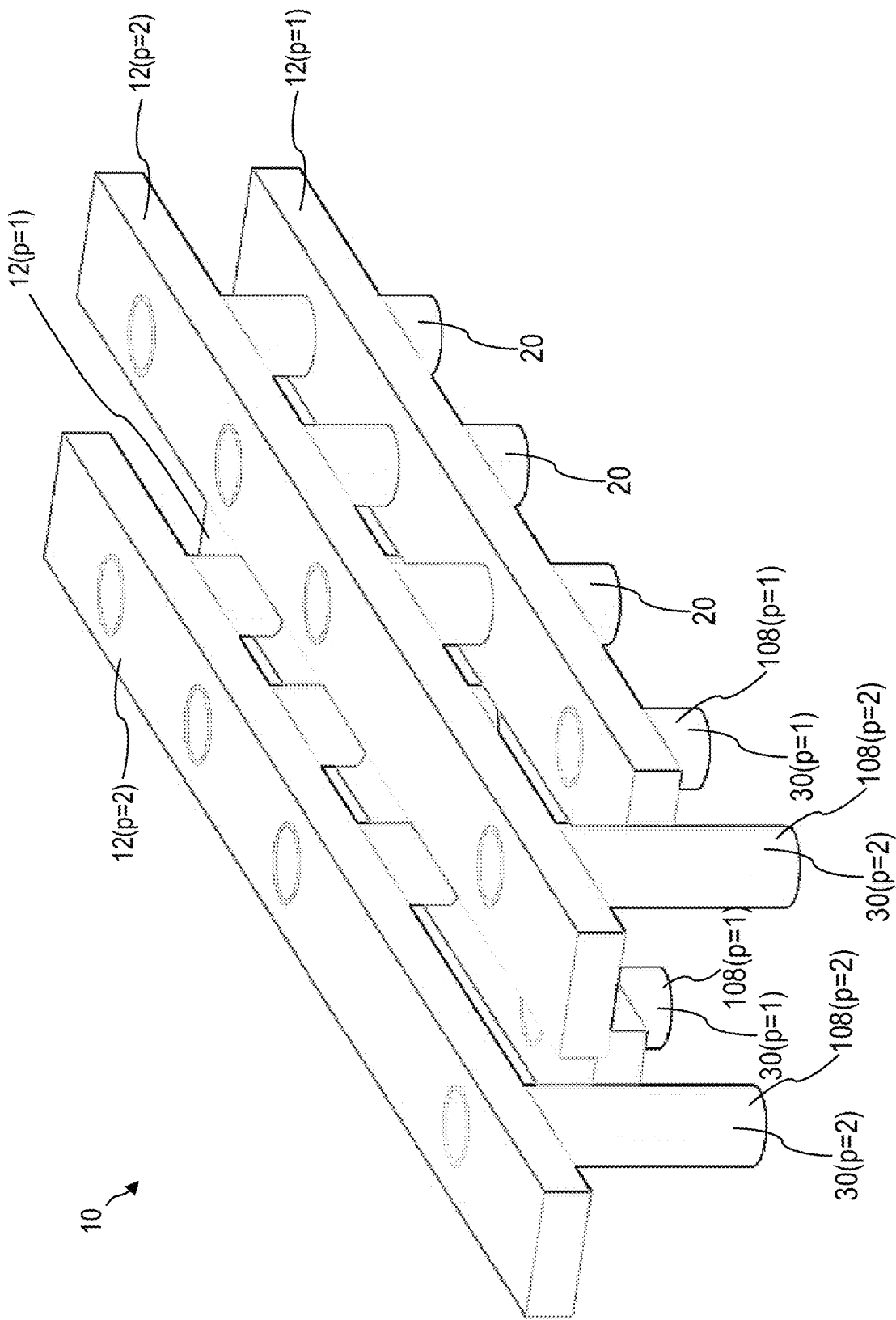

FIGS. 3B and 3C each schematically show an example of contacting electrode layers of a memory cell arrangement 10, according to various aspects. Each electrode layer 12(*p*) may include one or more additional through holes. Each additional through hole may extend from the first surface 14(*p*) to the second surface 16(*p*) of the respective electrode layer 12(*p*). The memory cell 10 may further include, for each electrode layer 12(*p*), one or more additional electrode pillars 30(*p*). At least a portion of each additional electrode pillar 30(*p*) may be disposed within a through hole of a corresponding electrode layer. Each additional electrode pillar 30(*p*) may be configured to electrically contact the respective electrode layer 12(*p*). According to various aspects, the one or more additional electrode pillars 30(*p*) corresponding to an electrode layer 12(*p*) may be configured as a control line 108(*p*), such as a plateline 108(*p*).

FIG. 3B exemplarily shows a memory cell arrangement 10 for N=2, M=3, and P=2, i.e., two electrode layers 12(1-2) and an array A(n=1-2, m=1-3) of 2×3 electrode pillars 20(*n, m*), wherein each electrode layer 12(*p*) may be contacted via two additional electrode pillars 30(*p*).

FIG. 3C exemplarily shows a memory cell arrangement 10 for N=2, M=3, and P=2, wherein each of the first electrode layer 12(1) and the second electrode layer 12(2) include a first electrode layer portion and a second electrode layer portion. The first electrode layer portion and the second electrode layer portion may be physically separated and/or electrically isolated from one another. For each electrode layer 12(*p*), each of the first electrode layer portion and the second electrode layer portion may be connected to at least one associated additional electrode pillar 30(*p*) and both, the first electrode layer portion and the second electrode layer portion of a respective electrode layer 12(*p*), may be contacted via the two (or more) corresponding additional electrode pillars 30(*p*).

It is understood that other configurations of a memory cell arrangement 100 may be configured in the same or in a similar way for N greater 2, M greater 3, P greater 2, and/or any number of additional electrode pillars, according to various aspects.

Figure 4A:
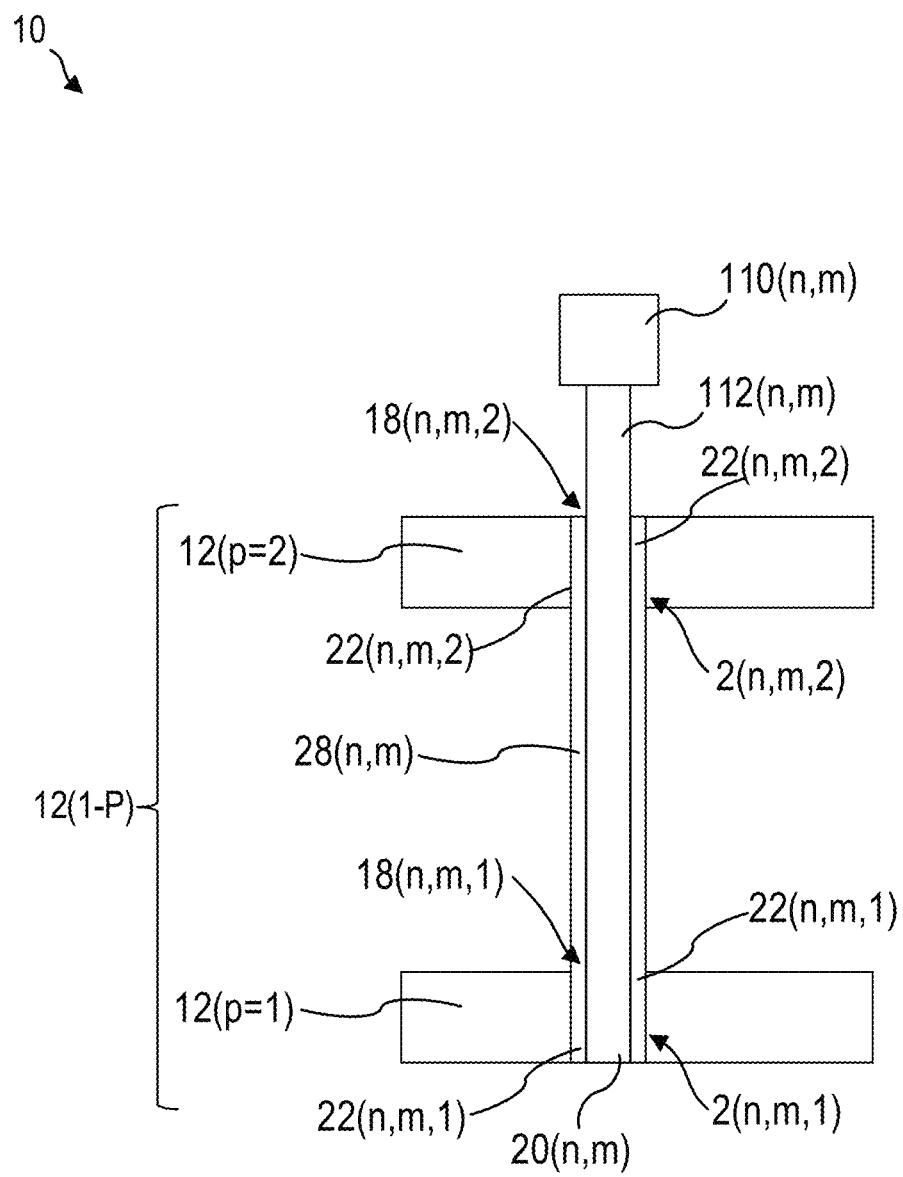
FIGS. 4A to 4C schematically show examples of memory cell arrangements including access devices, according to various aspects.

FIG. 4A schematically illustrates a segment of a memory cell arrangement 10, according to various aspects. According to various aspects, the memory cell arrangement 10 may include a plurality of access devices 110(1-N, 1-M). Each electrode pillar 20(*n, m*) of the plurality of electrode pillars 20(1-N, 1-M) may be coupled (e.g., electrically conductively connected) to a corresponding access device 110(*n, m*) of the plurality of access devices 110(1-N, 1-M).

According to various aspects, each access device 110(*n, m*) may be coupled (e.g., electrically conductively connected) to a respective electrode pillar 20(*n, m*) via a control line 112(*n, m*), such as a sourceline 112(*n, m*). Each electrode pillar 20(*n, m*) of the plurality of electrode pillars 20(1-N, 1-M) may form at least a part of the sourceline 112(*n, m*).

Figure 4B:
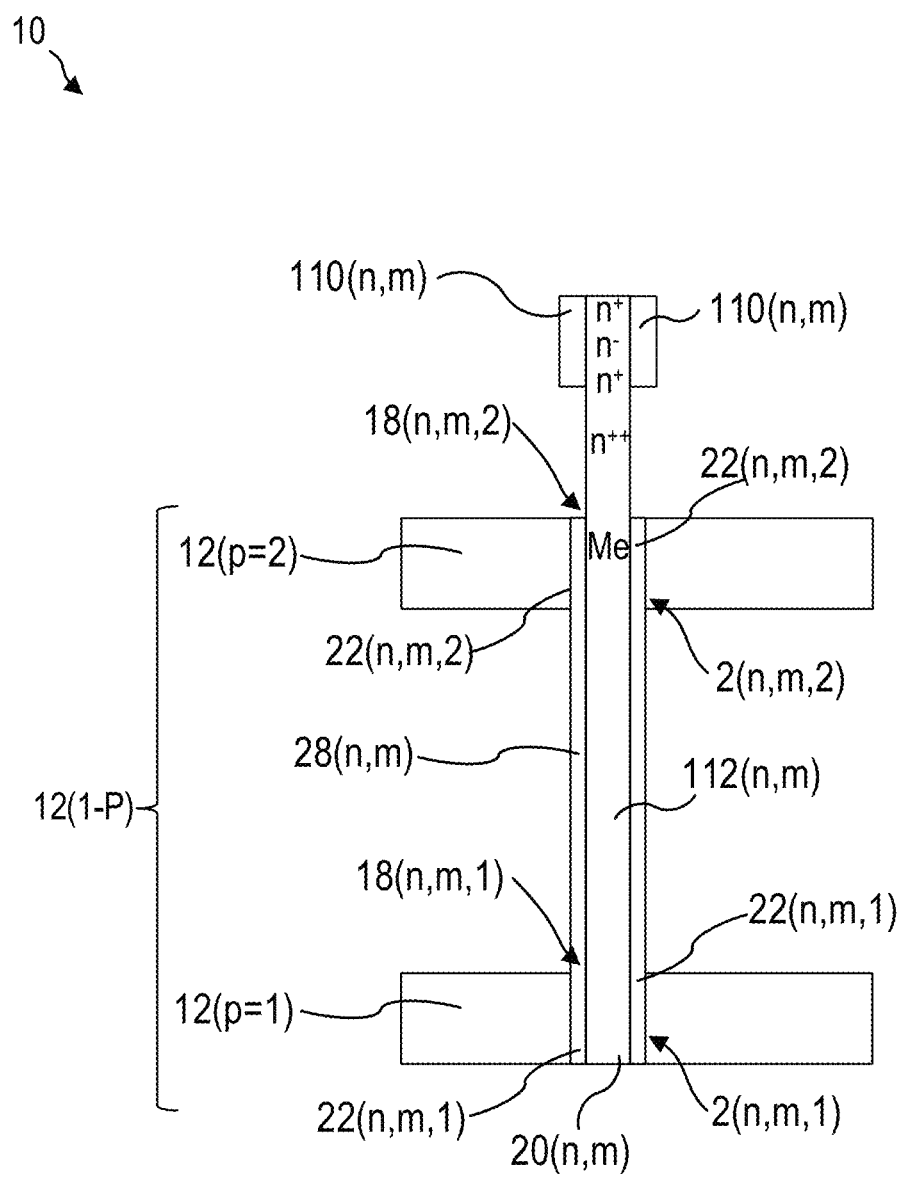

FIG. 4B schematically illustrates a segment of a memory cell arrangement 10, according to various aspects. According to various aspects, each access device 110(*n, m*) (of the plurality of access device 110(1-N, 1-M)) may include a respective transmission gate or a respective transistor, such as a field-effect transistor. For example, the electrode pillar 20(*n, m*) may include a metal portion (e.g., as a part of one or more FeCAP memory cells) and a semiconductor portion (e.g., as a part of the access device 110(*n, m*)). A highly doped semiconductor portion (e.g., a degenerated semiconductor portion, such as Poly-Si) may be disposed between the metal portion and the semiconductor portion to prohibit a Schottky-contact. According to various aspects, the electrode pillar 20(*n, m*) may include or may consist of a degenerated semiconductor.

Figure 4C:
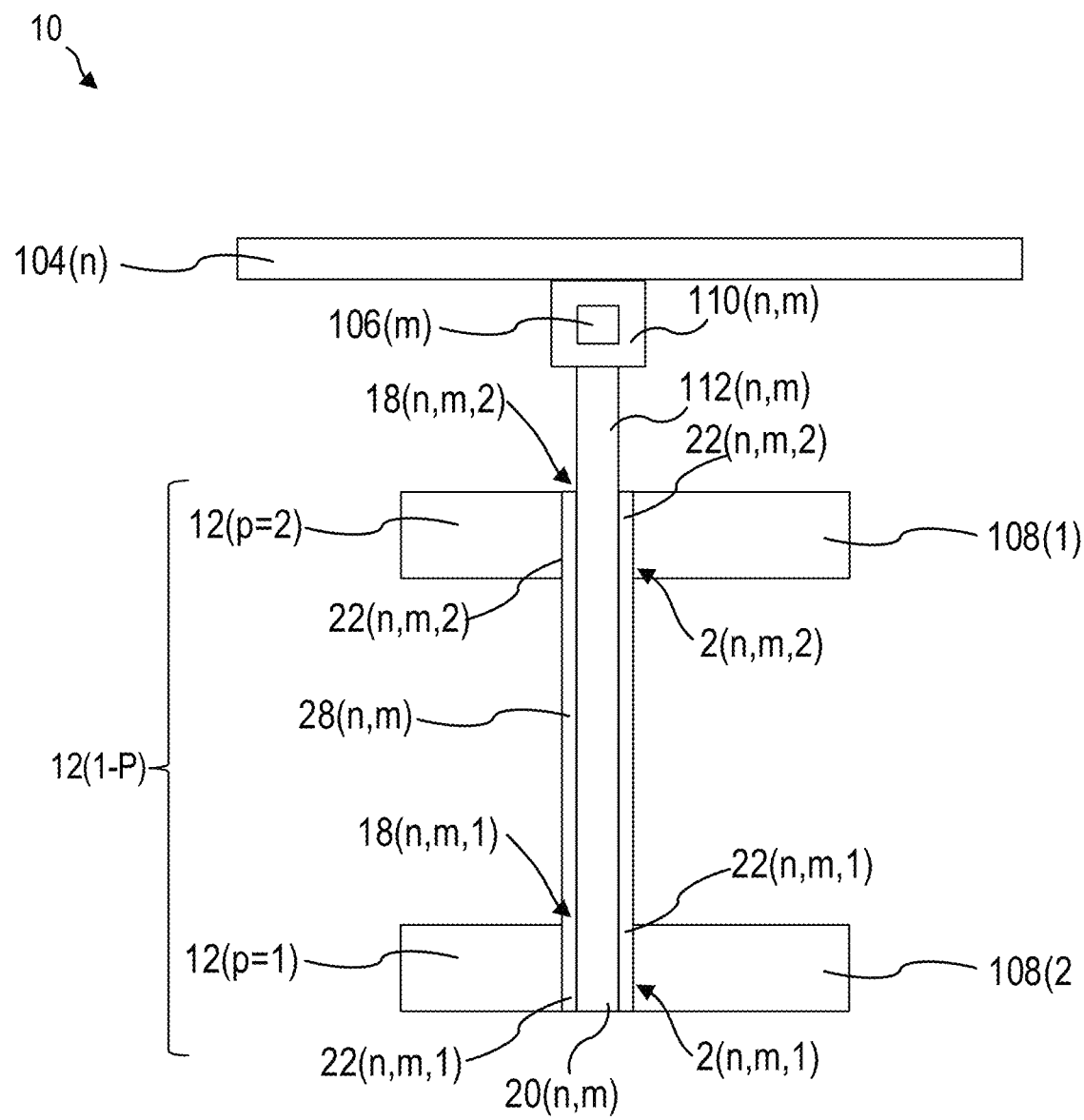

FIG. 4C schematically illustrates a segment of a memory cell arrangement 10, according to various aspects. According to various aspects, each access device 110(*n, m*) of the plurality of access device 110(1-N, 1-M) may be connected to a first control line 104(*n*), such as a bitline 104(*n*), and a second control line 106(*m*), such as a wordline 106(*m*). Each electrode layer 12(*p*) may be connected to a third control line 108(*p*), such as a plateline 108(*p*), and/or may form at least a part of the third control line 108(*p*). The corresponding electrode pillar 20(*n, m*) may form at least a part of a fourth control line 112(*n, m*), such as a sourceline 112(*n, m*).

For example, each access device 110(*n, m*) may include a first control node (e.g., a source node), a second control node (e.g., a gate node), and a third node (e.g., a drain node). The first control node of each access device 110(*n, m*) may be connected to the corresponding first control line 104(*n*) of the plurality of first control lines 104(1-N). The second control node of each access device 110(*n, m*) may be connected to the corresponding second control line 106(*m*) of the plurality of second control lines 106(1-M). The third control node of each access device 110(*n, m*) may be connected to the corresponding fourth control line 112(*n, m*) of the plurality of fourth control lines 112(1-N, 1-M). An electrical behavior of the first control node and the third control node of an access device 110(*n, m*), e.g., each access device, may be controlled by a voltage applied at the second control node. The electrical behavior may include an electrical resistance associated with an electrical current flow between the first control node and the third control node.

According to various aspects, each memory cell 2(*n, m, p*) of the plurality of memory cells 2(1-N, 1-M, 1-P) may be associated with a corresponding first control line 104(*n*) of the plurality of first control lines 104(1-N), a corresponding second control line 106(*m*) of the plurality of second control lines 106(1-M), and a corresponding third control line 108(*p*) of the plurality of third control lines 108(1-P). Each memory cell 2(*n, m, p*) of the plurality of memory cells 2(1-N, 1-M, 1-P) may be addressable via the fourth control line 112(*n, m*) corresponding to the electrode pillar 20(*n, m*) of a respective memory cell 2(*n, m, p*) and the third control line corresponding to the electrode layer 12(*p*) of the memory cell 2(*n, m, p*).

Figure 5A:
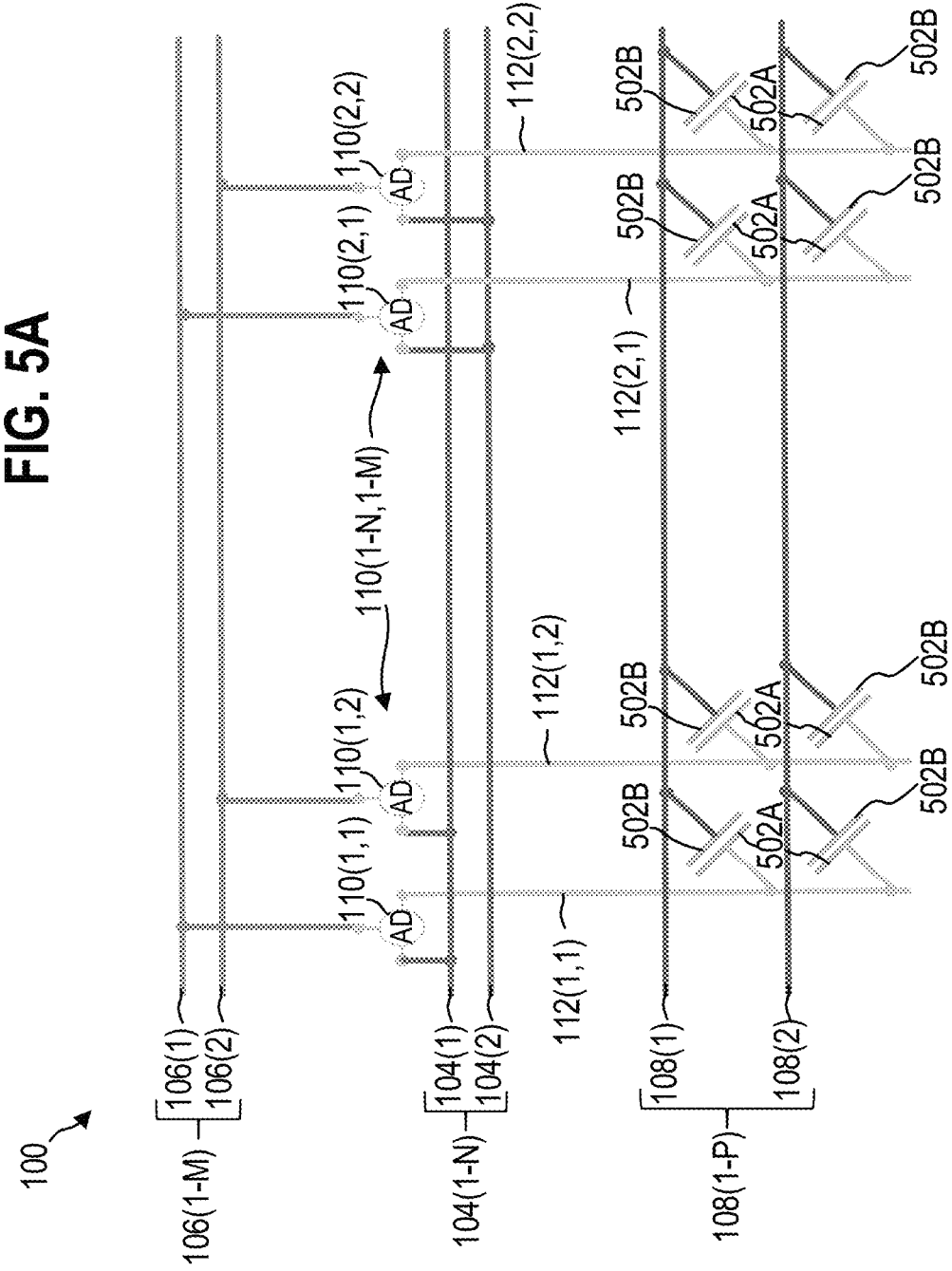
FIG. 5A schematically shows an exemplary configuration of a memory cell arrangement, according to various aspects.
Figure 5B:
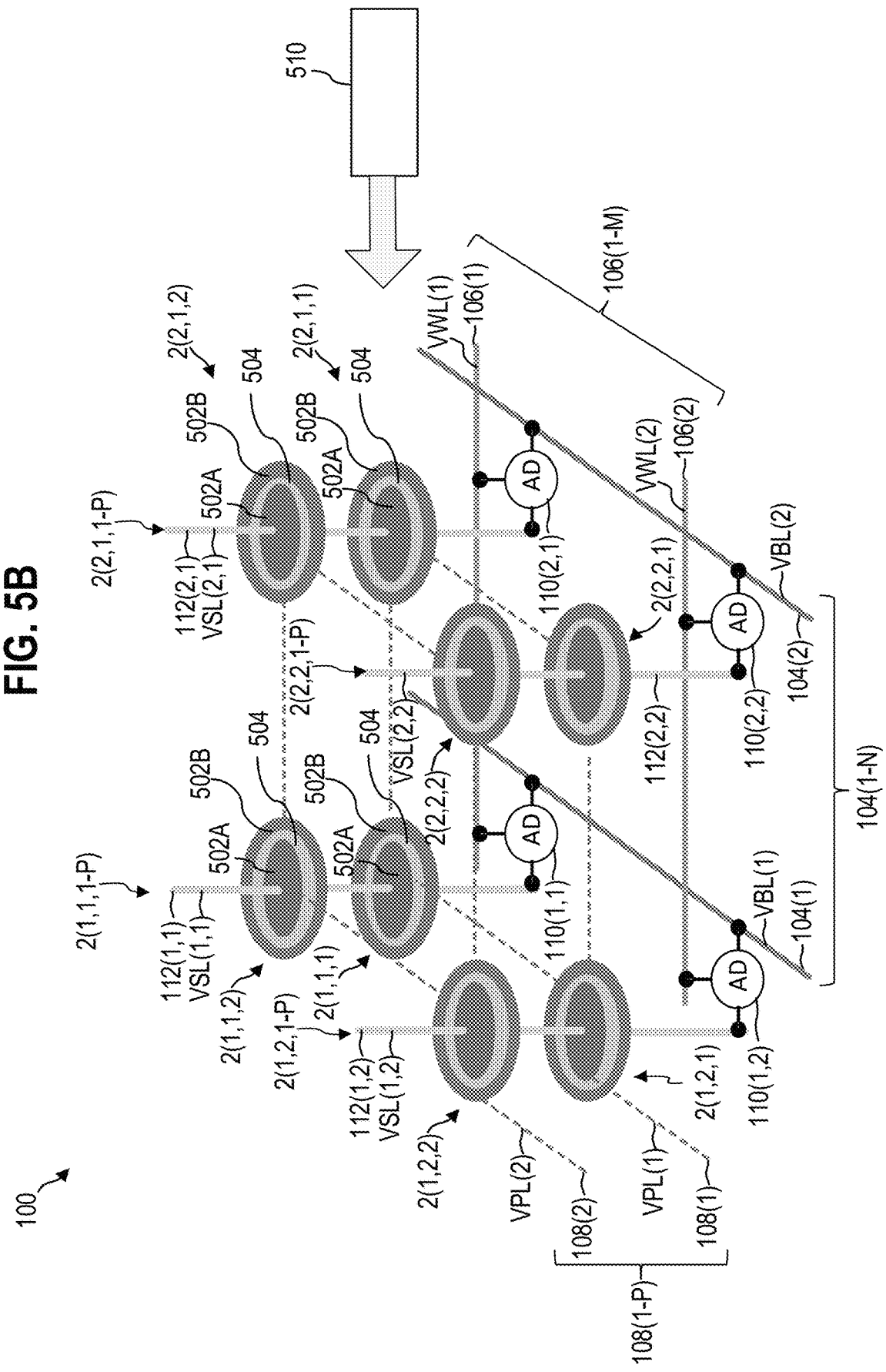
FIG. 5B shows a perspective view of a memory cell arrangement driven by one or more control circuits, according to various aspects.

FIG. 5A illustrates schematically an exemplary configuration of a capacitor-based memory cell arrangement 100 according to various aspects. FIG. 5B illustrates schematically a perspective view of a capacitor-based memory cell arrangement 100 according to various aspects. The capacitor-based memory cell arrangement 100 may correspond substantially to the memory cell arrangement 10, wherein the plurality of electrode pillars 20(n, m) may provide a plurality of first electrode portions 502A, each first electrode portion 502A of the plurality of first electrode portions 502A may be associated with a memory cell 2(n, m, p) of the plurality of memory cells 2(1-N, 1-M, 1-P), and wherein the plurality of electrode layers 12(p) may provide a plurality of second electrode portions 502B, each second electrode portion 502B of the plurality of second electrode portions 502B may be associated with a memory cell 2(n, m, p) of the plurality of memory cells 2(1-N, 1-M, 1-P).

According to various aspects, each memory cell 2(n, m, p) may be a capacitor-based memory cell 2(n, m, p) and the first electrode portion 502A may be or may include a first electrode of a capacitor and the second electrode portion 502B may be or may include a second electrode of the capacitor.

According to various aspects, a remanent-polarizable portion may be arranged between the first electrode portion 502A and the second electrode portion 502B of each capacitor-based memory cell 2(n, m, p) of the plurality of memory cells 2(1-N, 1-M, 1-P). The remanent-polarizable portion together with the adjacent first electrode portion 502A and second electrode portion 502B forms, in some aspects, a FeCAP that can be used as memory cell.

Each first electrode portion 502A of a respective memory cell 2(n, m, p) may be connected (e.g., electrically conductively connected) to the corresponding access device 110(n, m). For example, the respective first electrode portions 502A of the memory cells 2(n*, m*, 1-P) may be electrically conductively connected to the corresponding access device 110(n*, m*).

Each second electrode portion 502B of a respective memory cell 2(n, m, p) may be connected (e.g., electrically conductively connected) to the corresponding third control line 108(p) of the plurality of third control lines 108(1-P). For example, each second electrode portion 502B of the memory cells 2(1-N, 1-M, p*) may be connected (e.g., electrically conductively connected) to the corresponding third control line 108(p*).

For example, each capacitor-based memory cell 2(n, m, p) may be a ferroelectric capacitor-based memory cell 2(n, m, p), e.g., a FeCAP. The memory cell arrangement 100 may include or may be part of a non-volatile ferroelectric (capacitor-based) memory cell arrangement, such as a ferroelectric random access memory (FeRAM). As shown in FIG. 5B, a ferroelectric portion 504 (e.g., a ferroelectric layer) may be arranged between the first electrode portion 502A and the second electrode portion 502B of each ferroelectric capacitor-based memory cell 2(n, m, p) of the plurality of memory cells 2(1-N, 1-M, 1-P). The ferroelectric portion 504 may correspond substantially to the remanent-polarizable portion 22(n, m, p).

With respect to FIG. 5B, the memory cell arrangement 100 may be driven by one or more control circuits 510, according to various aspects.

The one or more control circuits 510 may include a write control circuit. The write control circuit may be configured to write (e.g., to program and/or erase) one of the memory cells 2(n, m, p), such as the memory cell 2(n*, m*, p*). The write control circuit may be configured to supply (e.g., to apply) one or more voltages VBL(1-N) to the plurality of first control lines 104(1-N). The write control circuit may be configured to supply one or more voltages VWL(1-M) to the plurality of second control lines 106(1-M). The write control circuit may be configured to supply one or more voltages VPL(1-P) to the plurality of third control lines 108(1-P). The write control circuit may be configured to supply one or more voltages VBL(1-N) to the plurality of first control lines 104(1-N), one or more voltages VWL(1-M) to the plurality of second control lines 106(1-M), and one or more voltages VPL(1-P) to the plurality of third control lines 108(1-P) such that a memory cell to be written 2(n*, m*, p*) is written and other one or more memory cells 2((n, m, p) \(n*, m*, p*)) are not written (i.e., one or more memory cells 2(n, m, p) except for the memory cell to be written 2(n*, m*, p*)).

The memory cell to be written 2(n*, m*, p*) may be associated with a first control line 104(n*) of the plurality of first control lines 104(1-N). The memory cell to be written 2(n*, m*, p*) may be associated with a second control line 106(m*) of the plurality of second control lines 106(1-M). The memory cell to be written 2(n*, m*, p*) may be associated with a third control line 108(p*) of the plurality of third control lines 108(1-P). The write control circuit may be configured to write the memory cell to be written 2(n*, m*, p*) by supplying (e.g., applying) a first voltage VBL(n*) to the associated first control line 104(n*), a second voltage VWL(m*) to the associated second control line 106(m*), and a third voltage VPL(p*) to the associated third control line 108(p*).

According to various aspects, the write control circuit may be further configured to supply (e.g., apply) another first voltage (e.g., a first inhibit voltage) VBL(n\n*) to one or more other first control lines 104(n\n*). The write control circuit may be further configured to supply (e.g., apply) another second voltage (e.g., a second inhibit voltage) VWL(m\m*) to one or more other second control lines 106(m\m*). The write control circuit may be further configured to supply (e.g., apply) another third voltage (e.g., a third inhibit voltage) VPL(p\p*) to one or more other third control lines 108(p\p*).

As described above, each access device 110(n, m) of the plurality of access devices 110(1-N, 1-M) may be associated with a first control line 104(n) of the plurality of first control lines 104(1-N) and a second control line 106(m) of the plurality of second control lines 106(1-M). Each memory cell 2(n, m, p) may be associated with an access device 110(n, m) of the plurality of access devices.

The write control circuit may be configured to supply (e.g., apply), for each access device 110((n, m) \(n*, m*)) of the plurality of access devices 110(1-N, 1-M) not associated with the memory cell to be written 2(n*, m*, p*), a first inhibit voltage VBL(n\n*) to the corresponding first control line or first control lines 104(n\n*) and a second inhibit voltage VWL(m\m*) to the corresponding second control line or second control lines 106(m\m*) such that a connection between the corresponding first control 104(n\n*) and the associated memory cells (not including the memory cell to be written 2(n*, m*, p*)) is prohibited.

The write control circuit may be configured to supply (e.g., apply) a third inhibit voltage VPL(p\p*) to the respective third control line or third control lines 108(p\p*) such that all memory cells 2(1-N, 1-M, p\p*) sharing a respective third control line 108(p\p*) of the one or more other third control lines 108(1-P\p*) do not change into another of the at least two memory states of the respective memory cell. For example, the memory cells 2(n\n*, m\m*, 1-P) of a first memory cell set associated with an access device 110((n, m) \(n*, m*)), for which a connection to the respective first control line 104(n\n*) is prohibited, a floating potential may occur. The third inhibit voltage VPL(p\p*) supplied to the respective third control line 108(p\p*) may be higher (e.g., at least ten times higher) than the occurring floating potential.

According to various aspects, the memory cell to be written 2(n*, m*, p*) may be further associated with a fourth control line 112(n*, m*) of the plurality of fourth control lines 112(1-N, 1-M). The write control circuit may be further configured to supply (e.g., apply) one or more fourth voltages VSL(1-N, 1-M) (e.g., a fourth voltage, e.g., one or more fourth inhibit voltages) to one or more fourth control lines 112 ((n, m) \(n*, m*)) not associated with the memory cell to be written 2(n*, m*, p*) (e.g., all fourth control lines 112((1-N, 1-M)\(n*, m*)) not associated with the memory cell to be written 2(n*, m*, p*)).

For example, writing the memory cell to be written 2(n*, m*, p*) may include programming the memory cell 2(n*, m*, p*) and the absolute value of the difference between the first voltage VBL(n*) applied to the associated first control line 104(n*) (of the memory cell to be written 2(n*, m*, p*)) and the third voltage VPL(p*) applied to the associated third control line 108(p*) may be larger than the absolute value of a coercive voltage of the ferroelectric portion 504.

As an example with respect to FIG. 5B, the write control circuit may be configured to write the memory cell 2(1,1,1) by supplying (e.g., applying) a first voltage VBL(1) to the associated first control line 104(1), a second voltage VWL(1) to the associated second control line 106(1), and a third voltage VPL(1) to the associated third control line 108(1). The write control circuit may be further configured (e.g., during writing the memory cell to be written 2(1,1,1)) by supplying (e.g., applying) a first inhibit voltage VBL(2) to the other first control line 104(2), a second inhibit voltage VWL(2) to the other second control line 106(2), and a third inhibit voltage VPL(2) to the other third control line 108(2). The write control circuit may be further configured (e.g., while writing the memory cell to be written 2(1,1,1)) by supplying (e.g., applying) a fourth inhibit voltage VSL(1,2) to the fourth control line 112(1,2), a fourth inhibit voltage VSL(2,1) to the fourth control line 112(2,1), and/or a fourth inhibit voltage VSL(2,2) to the fourth control line 112(2,2).

According to various aspects, each memory cell 2(n, m, p) of the plurality of memory cells 2(1-N, 1-M, 1-P) may include a respective ferroelectric portion 504. At each ferroelectric portion 504 a respective voltage may occur (e.g., indirectly applied depending on the applied voltages VBL(1-N), VWL(1-M), VPL(1-P), and/or VSL(1-N, 1-M). The write control circuit may be configured to write the memory cell to be written 2(n*, m*, p*) and the voltage at the ferroelectric portion 504 of the memory cell to be written 2(n*, m*, p*) may be substantially equal to absolute value of the difference between the first voltage VBL(n*) applied to the associated first control line 104(n*) and the third voltage VPL(p*) applied to the associated third control line 108(p*). It is noted that the formulation "voltage at the ferroelectric portion" is used herein to include a voltage drop over and/or a voltage drop across the ferroelectric portion. The voltage at the ferroelectric portions 504 of the memory cells 2(n*, m*,1-P\p*) may be substantially equal to absolute value of the difference between the first voltage VBL(n*) applied to the associated first control line 104(n*) and the third inhibit voltage VPL(p\p*) applied to the other third control line or third control lines 108(p\p*). The fourth control line associated with an access device for which a second inhibit voltage VWL(m\m*) is supplied to the corresponding second control line 106(m\m*) may have a floating potential (e.g., the respective fourth control line may be floating), implying a high impedance. The voltage at the ferroelectric portions 504 of the memory cells 2(n*, 1-M\m*, p*) may be about the absolute value of the difference between the third voltage VPL(p*) applied to the associated third control line 108(p*) and the third inhibit voltage VPL(p\p*) applied to the other third control line or third control lines 108(p\p*). The voltage at the ferroelectric portions 504 of the memory cells 2(n*, 1-M\m*, 1-P\p*) may have a voltage value of about 0V. The voltage at the ferroelectric portions 504 of the memory cells 2(1-N\n*, m*, p*) may be substantially equal to absolute value of the difference between the first inhibit voltage VBL(n\n*) applied to the other first control line or first control lines 104(n\n*) and the third voltage VPL(p*) applied to the corresponding third control line 108(p*). The voltage at the ferroelectric portions 504 of the memory cells 2(1-N\n*, m*, 1-P\p*) may be substantially equal to absolute value of the difference between the first inhibit voltage VBL(n\n*) applied to the other first control line or first control lines 104(n\n*) and the third inhibit voltage VPL(p\p*) applied to the other third control line or third control lines 108(p\p*). The voltage at the ferroelectric portions 504 of the memory cells 2(1-N\n*, 1-M\m*, p*) may be about the absolute value of the difference between the third voltage VPL(p*) applied to the associated third control line 108(p*) and the third inhibit voltage VPL(p\p*) applied to the other third control line or third control lines 108(p\p*). The voltage at the ferroelectric portions 504 of the memory cells 2(1-N\n*, 1-M\m*, 1-P\p*) may have a voltage value of about 0V.

According to an example, each access device 110(n, m) of the plurality of access devices 110(1-N, 1-M) may include a respective field-effect transistor (e.g., an NFET) and the write control circuit may be configured to program the memory cell to be written 2(n*, m*, p*) by supplying (e.g., applying) a first voltage VBL(n*) having a voltage value of 2V to the associated first control line 104(n*), a second voltage VWL(m*) having a voltage value of 2.5V to the associated second control line 106(m*), and a third voltage VPL(p*) having a voltage value of 0V to the associated third control line 108(p*). The write control circuit may be further configured (e.g., during programming the memory cell to be written 2(n*, m*, p*)) to supply (e.g., apply) a first inhibit voltage VBL(n\n*) having a voltage value of 0V to the corresponding first control line or first control lines 104(n\n*), a second inhibit voltage VWL(m\m*) having a voltage value of 0V to the corresponding second control line or second control lines 106(m\m*), and/or a third inhibit voltage VPL(p\p*) having a voltage value of 1V to the corresponding third control line or third control lines 108(p\p*). Each memory cell 2(n, m, p) of the plurality of memory cells 2(1-N, 1-M, 1-P) may include a respective ferroelectric portion 504 and the voltage at the ferroelectric portion 504 of the memory cell to be programmed 2(n*, m*, p*) may have a voltage value of +2V, the voltage at the ferroelectric portions 504 of the memory cells 2(n*, m*, 1-P\p*) may have a voltage value of +1V, the voltage at the ferroelectric portions 504 of the memory cells 2(n*, 1-M\m*, p*) may have a voltage value of about +1V, the voltage at the ferroelectric portions 504 of the memory cells 2(n*, 1-M\m*, 1-P\p*) may have a voltage value of about 0V, the voltage at the ferroelectric portions 504 of the memory cells 2(1-N\n*, m*, p*) may have a voltage value of about 0V, the voltage at the ferroelectric portions 504 of the memory cells 2(1-N\n*, m*,1-P\p*) may have a voltage value of about +1V, the voltage at the ferroelectric portions 504 of the memory cells 2(1-N\n*, 1-M\m*, p*) may have a voltage value of about +1V, and/or the voltage at the ferroelectric portions 504 of the memory cells 2(1-N\n*, 1-M\m*, 1-P\p*) may have a voltage value of about 0V.

According to an example, each access device 110(n, m) of the plurality of access devices 110(1-N, 1-M) may include a respective transmission gate and the write control circuit may be configured to program the memory cell to be written $2(n^*, m^*, p^*)$ by supplying (e.g., applying) a first voltage VBL(n*) having a voltage value of 1V to the associated first control line $104(n^*)$, a second voltage VWL(m*) having a voltage value of 1.5V to the associated second control line $106(m^*)$, and a third voltage VPL(p*) having a voltage value of −1V to the associated third control line $108(p^*)$. The write control circuit may be further configured (e.g., during programming the memory cell to be written $2(n^*, m^*, p^*)$) to supply (e.g., apply) a first inhibit voltage VBL(n\n*) having a voltage value of 0V to the corresponding first control line or first control lines $104(n\backslash n^*)$, a second inhibit voltage VWL(m\m*) having a voltage value of 0V to the corresponding second control line or second control lines $106(m\backslash m^*)$, and/or a third inhibit voltage VPL(p\p*) having a voltage value of 0V to the corresponding third control line or third control lines $108(p\backslash p^*)$. Each memory cell $2(n, m, p)$ of the plurality of memory cells 2(1-N, 1-M, 1-P) may include a respective ferroelectric portion 504 and the voltage at the ferroelectric portion 504 of the memory cell to be programmed $2(n^*, m^*, p^*)$ may have a voltage value of +2V, the voltage at the ferroelectric portions 504 of the memory cells $2(n^*, m^*, 1\text{-}P\backslash p^*)$ may have a voltage value of +1V, the voltage at the ferroelectric portions 504 of the memory cells $2(n^*, 1\text{-}M\backslash m^*, p^*)$ may have a voltage value of about +1V, the voltage at the ferroelectric portions 504 of the memory cells $2(n^*, 1\text{-}M\backslash m^*, 1\text{-}P\backslash p^*)$ may have a voltage value of about 0V, the voltage at the ferroelectric portions 504 of the memory cells $2(1\text{-}N\backslash n^*, m^*, p^*)$ may have a voltage value of about +1V, the voltage at the ferroelectric portions 504 of the memory cells $2(1\text{-}N\backslash n^*, m^*, 1\text{-}P\backslash p^*)$ may have a voltage value of about 0V, the voltage at the ferroelectric portions 504 of the memory cells $2(1\text{-}N\backslash n^*, 1\text{-}M\backslash m^*, p^*)$ may have a voltage value of about +1V, and/or the voltage at the ferroelectric portions 504 of the memory cells $2(1\text{-}N\backslash n^*, 1\text{-}M\backslash m^*, 1\text{-}P\backslash p^*)$ may have a voltage value of about 0V.

According to an example, each access device $110(n, m)$ of the plurality of access devices 110(1-N, 1-M) may include a respective field-effect transistor (e.g., an NFET) and the write control circuit may be configured to erase the memory cell to be written $2(n^*, m^*, p^*)$ by supplying (e.g., applying) a first voltage VBL(n*) having a voltage value of 0V to the associated first control line $104(n^*)$, a second voltage VWL(m*) having a voltage value of 2.5V to the associated second control line $106(m^*)$, and a third voltage VPL(p*) having a voltage value of 2V to the associated third control line $108(p^*)$. The write control circuit may be further configured (e.g., during erasing the memory cell to be written $2(n^*, m^*, p^*)$) to supply (e.g., apply) a first inhibit voltage VBL(n\n*) having a voltage value of 0V to the corresponding first control line or first control lines $104(n\backslash n^*)$, a second inhibit voltage VWL(m\m*) having a voltage value of 0V to the corresponding second control line or second control lines $106(m\backslash m^*)$, and/or a third inhibit voltage VPL(p\p*) having a voltage value of 1V to the corresponding third control line or third control lines $108(p\backslash p^*)$. Each memory cell $2(n, m, p)$ of the plurality of memory cells 2(1-N, 1-M, 1-P) may include a respective ferroelectric portion 504 and the voltage at the ferroelectric portion 504 of the memory cell to be erased $2(n^*, m^*, p^*)$ may have a voltage value of −2V, the voltage at the ferroelectric portions 504 of the memory cells $2(n^*, m^*, 1\text{-}P\backslash p^*)$ may have a voltage value of −1V, the voltage at the ferroelectric portions 504 of the memory cells $2(n^*, 1\text{-}M\backslash m^*, p^*)$ may have a voltage value of about −1V, the voltage at the ferroelectric portions 504 of the memory cells $2(n^*, 1\text{-}M\backslash m^*, 1\text{-}P\backslash p^*)$ may have a voltage value of about 0V, the voltage at the ferroelectric portions 504 of the memory cells $2(1\text{-}N\backslash n^*, m^*, p^*)$ may have a voltage value of about −1V, the voltage at the ferroelectric portions 504 of the memory cells $2(1\text{-}N\backslash n^*, m^*, 1\text{-}P\backslash p^*)$ may have a voltage value of about 0V, the voltage at the ferroelectric portions 504 of the memory cells $2(1\text{-}N\backslash n^*, 1\text{-}M\backslash m^*, p^*)$ may have a voltage value of about −1V, and/or the voltage at the ferroelectric portions 504 of the memory cells $2(1\text{-}N\backslash n^*, 1\text{-}M\backslash m^*, 1\text{-}P\backslash p^*)$ may have a voltage value of about 0V.

According to an example, each access device $110(n, m)$ of the plurality of access devices 110(1-N, 1-M) may include a respective transmission gate and the write control circuit may be configured to erase the memory cell to be written $2(n^*, m^*, p^*)$ by supplying (e.g., applying) a first voltage VBL(n*) having a voltage value of −1V to the associated first control line $104(n^*)$, a second voltage VWL(m*) having a voltage value of 1.5V to the associated second control line $106(m^*)$, and a third voltage VPL(p*) having a voltage value of 1V to the associated third control line $108(p^*)$. The write control circuit may be further configured (e.g., during erasing the memory cell to be written $2(n^*, m^*, p^*)$) to supply (e.g., apply) a first inhibit voltage VBL(n\n*) having a voltage value of 0V to the corresponding first control line or first control lines $104(n\backslash n^*)$, a second inhibit voltage VWL(m\m*) having a voltage value of 0V to the corresponding second control line or second control lines $106(m\backslash m^*)$, and/or a third inhibit voltage VPL(p\p*) having a voltage value of 0V to the corresponding third control line or third control lines $108(p\backslash p^*)$. Each memory cell $2(n, m, p)$ of the plurality of memory cells 2(1-N, 1-M, 1-P) may include a respective ferroelectric portion 504 and the voltage at the ferroelectric portion 504 of the memory cell to be erased $2(n^*, m^*, p^*)$ may have a voltage value of −2V, the voltage at the ferroelectric portions 504 of the memory cells $2(n^*, m^*, 1\text{-}P\backslash p^*)$ may have a voltage value of −1V, the voltage at the ferroelectric portions 504 of the memory cells $2(n^*, 1\text{-}M\backslash m^*, p^*)$ may have a voltage value of about −1V, the voltage at the ferroelectric portions 504 of the memory cells $2(n^*, 1\text{-}M\backslash m^*, 1\text{-}P\backslash p^*)$ may have a voltage value of about 0V, the voltage at the ferroelectric portions 504 of the memory cells $2(1\text{-}N\backslash n^*, m^*, p^*)$ may have a voltage value of about −1V, the voltage at the ferroelectric portions 504 of the memory cells $2(1\text{-}N\backslash n^*, m^*, 1\text{-}P\backslash p^*)$ may have a voltage value of about 0V, the voltage at the ferroelectric portions 504 of the memory cells $2(1\text{-}N\backslash n^*, 1\text{-}M\backslash m^*, p^*)$ may have a voltage value of about −1V, and/or the voltage at the ferroelectric portions 504 of the memory cells $2(1\text{-}N\backslash n^*, 1\text{-}M\backslash m^*, 1\text{-}P\backslash p^*)$ may have a voltage value of about 0V.

The one or more control circuits 510 may include a read control circuit. The read control circuit may be configured to read out one of the memory cells $2(n, m, p)$, such as the memory cell $2(n^*, m^*, p^*)$. According to various aspects, reading the memory cell to be read out $2(n^*, m^*, p^*)$ may include erasing (or programming) the memory cell to be read out $2(n^*, m^*, p^*)$. The read control circuit may be configured to supply one or more voltages VBL(1-N) to the plurality of first control lines 104(1-N). The read control circuit may be configured to supply one or more voltages VWL(1-M) to the plurality of second control lines 106(1-M). The read control circuit may be configured to supply one or more voltages VPL(1-P) to the plurality of third control lines 108(1-P). The read control circuit may be configured to supply one or more voltages VBL(1-N) to the plurality of first control lines 104(1-N), one or more voltages VWL(1-M) to the plurality of second control lines 106(1-M), and one or more voltages VPL(1-P) to the plurality of third control lines 108(1-P). The read control circuit may be configured to detect (e.g., using a sensing amplifier) a potential difference between the corresponding first control line 104(n*) and a reference potential such that a memory cell to be read out 2(n*, m*, p*) is read out and other one or more memory cells 2((n, m, p) \(n*, m*, p*)) are not read out (i.e., one or more memory cells 2(n, m, p) except for the memory cell to be read out 2(n*, m*, p*)). For example, a polarization-switch from a first polarization to a second polarization of the remanent-polarizable portion (e.g., the ferroelectric portion) (or vice versa) may lead to an increasing potential difference. For example, a potential difference may be higher if a polarization-switch occurs compared to no polarization-switch.

The memory cell to be read out 2(n*, m*, p*) may be associated with a first control line 104(n*) of the plurality of first control lines 104(1-N). The memory cell to be read out 2(n*, m*, p*) may be associated with a second control line 106(m*) of the plurality of second control lines 106(1-M). The memory cell to be read out 2(n*, m*, p*) may be associated with a third control line 108(p*) of the plurality of third control lines 108(1-P). The read control circuit may be configured to read out the memory cell to be read out 2(n*, m*, p*) by supplying (e.g., applying) a first voltage VBL(n*) to the associated first control line 104(n*), a second voltage VWL(m*) to the associated second control line 106(m*), and a third voltage VPL(p*) to the associated third control line 108(p*), and by detecting the potential difference between the corresponding first control line 104(n*) and the reference potential.

According to various aspects, the read control circuit may be further configured to supply (e.g., apply) another first voltage (e.g., a first inhibit voltage) VBL(n\n*) to one or more other first control lines 104(n\n*). The read control circuit may be further configured to supply (e.g., apply) another second voltage (e.g., a second inhibit voltage) VWL(m\m*) to one or more other second control lines 106(m\m*). The read control circuit may be further configured to supply (e.g., apply) another third voltage (e.g., a third inhibit voltage) VPL(p\p*) to one or more other third control lines 108(p\p*).

As described above, each access device 110(n, m) of the plurality of access devices 110(1-N, 1-M) may be associated with a first control line 104(n) of the plurality of first control lines 104(1-N) and a second control line 106(m) of the plurality of second control lines 106(1-M). Each memory cell 2(n, m, p) may be associated with an access device 110(n, m) of the plurality of access devices.

The read control circuit may be configured to supply (e.g., apply), for each access device 110((n, m) \(n*, m*)) of the plurality of access devices 110(1-N, 1-M) not associated with the memory cell to be read out 2(n*, m*, p*), a first inhibit voltage VBL(n\n*) to the corresponding first control line or first control lines 104(n\n*) and a second inhibit voltage VWL(m\m*) to the corresponding second control line or second control lines 106(m\m*) such that a connection between the corresponding first control 104(n\n*) and the associated memory cells (not including the memory cell to be read out 2(n*, m*, p*)) is prohibited.

The read control circuit may be configured to supply (e.g., apply) a third inhibit voltage VPL(p\p*) to the respective third control line or third control lines 108(p\p*) such that all memory cells 2(1-N, 1-M, p\p*) sharing a respective third control line 108(p\p*) of the one or more other third control lines 108(1-P\p*) do not change into another of the at least two memory states of the respective memory cell. For example, the memory cells 2(n\n*, m\m*, 1-P) of a first memory cell set associated with an access device 110((n, m) \(n*, m*)), for which a connection to the respective first control line 104(n\n*) is prohibited, a floating potential may occur. The third inhibit voltage VPL(p\p*) supplied to the respective third control line 108(p\p*) may be higher (e.g., at least ten times higher) than the occurring floating potential.

According to various aspects, the memory cell to be read out 2(n*, m*, p*) may be further associated with a fourth control line 112(n*, m*) of the plurality of fourth control lines 112(1-N, 1-M). The read control circuit may be further configured to supply (e.g., apply) one or more fourth voltages VSL(1-N, 1-M) (e.g., a fourth voltage, e.g., one or more fourth inhibit voltages) to one or more fourth control lines 112 ((n, m) \(n*, m*)) not associated with the memory cell to be read out 2(n*, m*, p*) (e.g., all fourth control lines 112((1-N, 1-M)\(n*, m*)) not associated with the memory cell to be read out 2(n*, m*, p*)).

The absolute value of the difference between the first voltage VBL(n*) applied to the associated first control line 104(n*) (of the memory cell to be read out 2(n*, m*, p*)) and the third voltage VPL(p*) applied to the associated third control line 108(p*) may be larger than the absolute value of a coercive voltage of the ferroelectric portion 504.

As an example with respect to FIG. 5B, the read control circuit may be configured to write the memory cell 2(1,1,1) by supplying (e.g., applying) a first voltage VBL(1) to the associated first control line 104(1), a second voltage VWL(1) to the associated second control line 106(1), and a third voltage VPL(1) to the associated third control line 108(1). The read control circuit may be further configured (e.g., during reading the memory cell to be read out 2(1,1,1)) by supplying (e.g., applying) a first inhibit voltage VBL(2) to the other first control line 104(2), a second inhibit voltage VWL(2) to the other second control line 106(2), and a third inhibit voltage VPL(2) to the other third control line 108(2). The read control circuit may be further configured (e.g., while reading the memory cell to be read out 2(1,1,1)) by supplying (e.g., applying) a fourth inhibit voltage VSL(1,2) to the fourth control line 112(1,2), a fourth inhibit voltage VSL(2,1) to the fourth control line 112(2,1), and/or a fourth inhibit voltage VSL(2,2) to the fourth control line 112(2,2).

According to various aspects, each memory cell 2(n, m, p) of the plurality of memory cells 2(1-N, 1-M, 1-P) may include a respective ferroelectric portion 504. At each ferroelectric portion 504 a respective voltage may occur (e.g., indirectly applied depending on the applied voltages VBL (1-N), VWL(1-M), VPL(1-P), and/or VSL(1-N, 1-M). The read control circuit may be configured to read out the memory cell to be read out 2(n*, m*, p*) and the voltage at the ferroelectric portion 504 of the memory cell to be read out 2(n*, m*, p*) may be substantially equal to absolute value of the difference between the first voltage VBL(n*) applied to the associated first control line 104(n*) and the third voltage VPL(p*) applied to the associated third control line 108(p*). The voltage at the ferroelectric portions 504 of the memory cells 2(n*, m*, 1-P\p*) may be substantially equal to absolute value of the difference between the first voltage VBL(n*) applied to the associated first control line 104(n*) and the third inhibit voltage VPL(p\p*) applied to the other third control line or third control lines 108(p\p*). The voltage at the ferroelectric portions 504 of the memory cells 2(n*, 1-M\m*, p*) may be about the absolute value of the difference between the third voltage VPL(p*) applied to the associated third control line 108(p*) and the third inhibit voltage VPL(p\p*) applied to the other third control line or third control lines 108(p\p*). The voltage at the ferroelectric portions 504 of the memory cells 2(n*, 1-M\m*, 1-P\p*)

may have a voltage value of about 0V. The voltage at the ferroelectric portions 504 of the memory cells 2(1-N\n*, m*, p*) may be substantially equal to absolute value of the difference between the first inhibit voltage VBL(n\n*) applied to the other first control line or first control lines 104(n\n*) and the third voltage VPL(p*) applied to the corresponding third control line 108(p*). The voltage at the ferroelectric portions 504 of the memory cells 2(1-N\n*, m*, 1-P\p*) may be substantially equal to absolute value of the difference between the first inhibit voltage VBL(n\n*) applied to the other first control line or first control lines 104(n\n*) and the third inhibit voltage VPL(p\p*) applied to the other third control line or third control lines 108(p\p*). The voltage at the ferroelectric portions 504 of the memory cells 2(1-N\n*, 1-M\m*, p*) may be about the absolute value of the difference between the third voltage VPL(p*) applied to the associated third control line 108(p*) and the third inhibit voltage VPL(p\p*) applied to the other third control line or third control lines 108(p\p*). The voltage at the ferroelectric portions 504 of the memory cells 2(1-N\n*, 1-M\m*, 1-P\p*) may have a voltage value of about 0V.

According to an example, each access device 110(n, m) of the plurality of access devices 110(1-N, 1-M) may include a respective field-effect transistor (e.g., an NFET) and the read control circuit may be configured to read out the memory cell to be read out 2(n*, m*, p*) by supplying (e.g., applying) a first voltage VBL(n*) having a voltage value of 0V to the associated first control line 104(n*), a second voltage VWL(m*) having a voltage value of 2.5V to the associated second control line 106(m*), and a third voltage VPL(p*) having a voltage value of 2V to the associated third control line 108(p*). The write control circuit may be further configured (e.g., during writing the memory cell to be written 2(n*, m*, p*)) to supply (e.g., apply) a first inhibit voltage VBL(n\n*) having a voltage value of 0V to the corresponding first control line or first control lines 104(n\n*), a second inhibit voltage VWL(m\m*) having a voltage value of 0V to the corresponding second control line or second control lines 106(m\m*), and/or a third inhibit voltage VPL(p\P*) having a voltage value of 1V to the corresponding third control line or third control lines 108(p\p*). Each memory cell 2(n, m, p) of the plurality of memory cells 2(1-N, 1-M, 1-P) may include a respective ferroelectric portion 504 and the voltage at the ferroelectric portion 504 of the memory cell to be read out 2(n*, m*, p*) may have a voltage value of −2V, the voltage at the ferroelectric portions 504 of the memory cells 2(n*, m*,1-P\p*) may have a voltage value of −1V, the voltage at the ferroelectric portions 504 of the memory cells 2(n*, 1-M\m*,p*) may have a voltage value of about −1V, the voltage at the ferroelectric portions 504 of the memory cells 2(n*, 1-M\m*, 1-P\p*) may have a voltage value of about 0V, the voltage at the ferroelectric portions 504 of the memory cells 2(1-N\n*, m*, p*) may have a voltage value of about 0V, the voltage at the ferroelectric portions 504 of the memory cells 2(1-N\n*, m*, 1-P\p*) may have a voltage value of about −1V, the voltage at the ferroelectric portions 504 of the memory cells 2(1-N\n*, 1-M\m*, p*) may have a voltage value of about −1V, and/or the voltage at the ferroelectric portions 504 of the memory cells 2(1-N\n*, 1-M\m*, 1-P\p*) may have a voltage value of about 0V.

According to an example, each access device 110(n, m) of the plurality of access devices 110(1-N, 1-M) may include a respective transmission gate and the write control circuit may be configured to erase the memory cell to be written 2(n*, m*, p*) by supplying (e.g., applying) a first voltage VBL(n*) having a voltage value of −1V to the associated first control line 104(n*), a second voltage VWL(m*) having a voltage value of 1.5V to the associated second control line 106(m*), and a third voltage VPL(p*) having a voltage value of 1V to the associated third control line 108(p*). The write control circuit may be further configured (e.g., during erasing the memory cell to be written 2(n*, m*, p*)) to supply (e.g., apply) a first inhibit voltage VBL(n\n*) having a voltage value of 0V to the corresponding first control line or first control lines 104(n\n*), a second inhibit voltage VWL(m\m*) having a voltage value of 0V to the corresponding second control line or second control lines 106(m\m*), and/or a third inhibit voltage VPL(p\p*) having a voltage value of 0V to the corresponding third control line or third control lines 108(p\p*). Each memory cell 2(n, m, p) of the plurality of memory cells 2(1-N, 1-M, 1-P) may include a respective ferroelectric portion 504 and the voltage at the ferroelectric portion 504 of the memory cell to be erased 2(n*, m*, p*) may have a voltage value of −2V, the voltage at the ferroelectric portions 504 of the memory cells 2(n*, m*, 1-P\p*) may have a voltage value of −1V, the voltage at the ferroelectric portions 504 of the memory cells 2(n*, 1-M\m*, p*) may have a voltage value of about −1V, the voltage at the ferroelectric portions 504 of the memory cells 2(n*, 1-M\m*, 1-P\p*) may have a voltage value of about 0V, the voltage at the ferroelectric portions 504 of the memory cells 2(1-N\n*, m*, p*) may have a voltage value of about −1V, the voltage at the ferroelectric portions 504 of the memory cells 2(1-N\n*, m*, 1-P\p*) may have a voltage value of about 0V, the voltage at the ferroelectric portions 504 of the memory cells 2(1-N\n*, 1-M\m*, p*) may have a voltage value of about −1V, and/or the voltage at the ferroelectric portions 504 of the memory cells 2(1-N\n*, 1-M\m*, 1-P\p*) may have a voltage value of about 0V.

FIG. 6 shows a schematic flow diagram of a method 600, e.g., a method for operating a memory cell arrangement 10 or a memory cell arrangement 100, according to various aspects.

The method 600 may include supplying (e.g., applying) a voltage to an electrode pillar associated with a memory cell to be addressed (e.g., to be programmed, erased, or read out) selected from a plurality of memory cells (in 602). The method 600 may include supplying (e.g., applying) the voltage to the electrode pillar associated with the memory cell to be addressed via an access device corresponding to the electrode pillar.

The method 600 may include that other memory cells of the plurality of memory cells are not operated (e.g., not addressed).

The method 600 may include supplying (e.g., applying) a voltage to an electrode pillar by supplying a first voltage to a first control line associated with the memory cell to be operated and by supplying a second voltage to a second control line associated with the memory cell to be operated.

The method 600 may include supplying (e.g., applying) a voltage to an electrode layer associated with the memory cell to be operated (in 604). The method 600 may include supplying (e.g., applying) the voltage to the electrode layer associated with the memory cell to be operated by supplying a third voltage to a third control line corresponding to the electrode layer.

According to various aspects, the method 600 may include supplying (e.g., applying) a first inhibit voltage to one or more first control lines of the plurality of first control lines not corresponding to the memory cell to be operated. The method 600 may further include supplying (e.g., applying) a second inhibit voltage to one or more second control lines of the plurality of second control lines not corresponding to the memory cell to be operated. The first inhibit voltage and the second inhibit voltage may be configured (e.g., selected such that) to prohibit connection between a first control line and one or more memory cells not to be operated via an associated access device.

The method 600 may further include supplying (e.g., applying) a third inhibit voltage to one or more third control lines of the plurality of third control lines not corresponding to the memory cell to be operated (e.g., one or more third control lines not corresponding to the electrode layer associated with the memory cell to be operated). The third inhibit voltage may be configured (e.g., selected such that) to prohibit that one or more memory cells not to be operated change into another one of at least two memory states of the respective memory cell.

Figure 7:
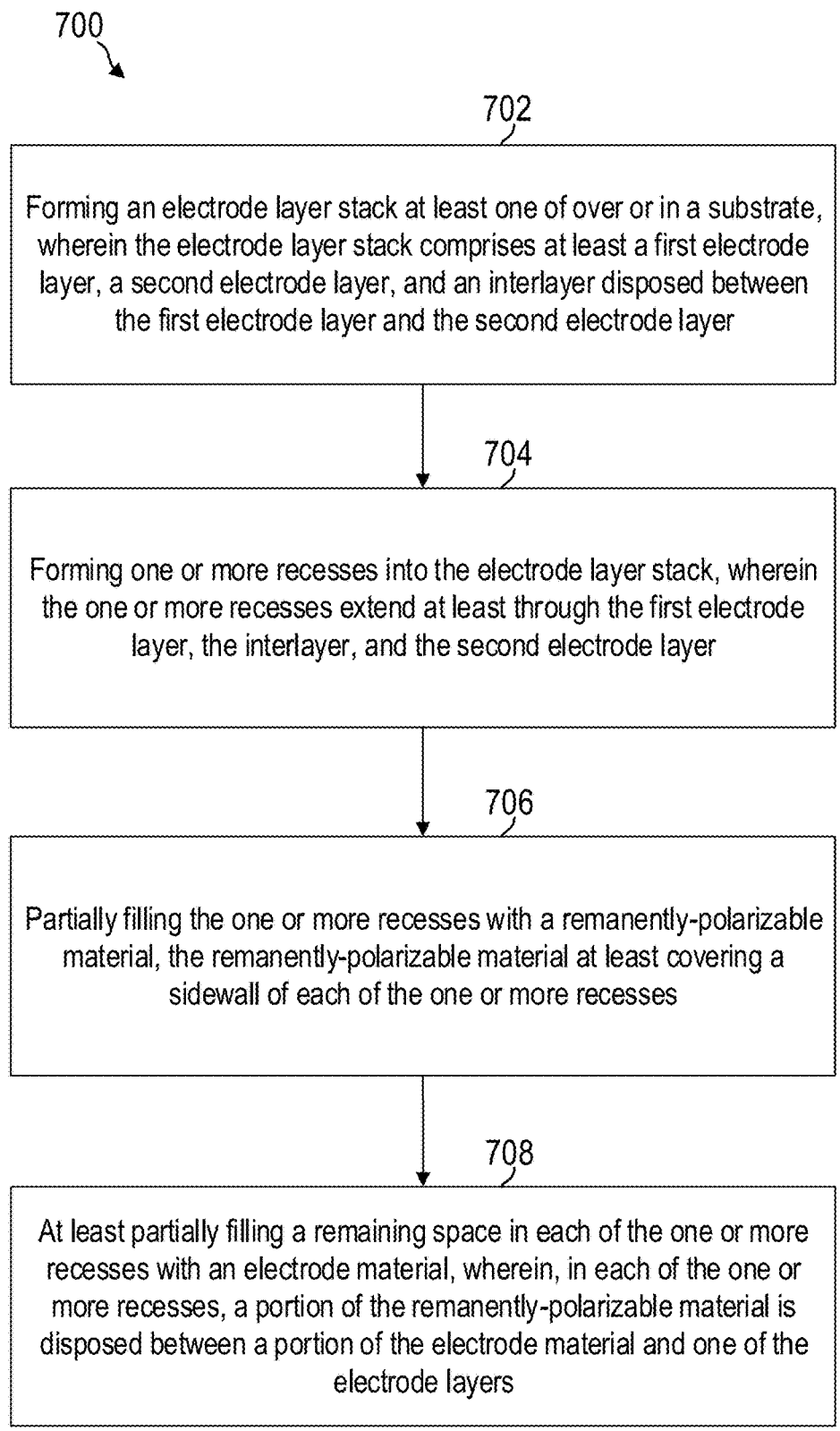
FIG. 7 shows a schematic flow diagram of a method for manufacturing a memory cell arrangement, according to various aspects.

FIG. 7 shows a schematic flow diagram of a method 700, e.g., a method for manufacturing a memory cell arrangement 10 or a memory cell arrangement 100, according to various aspects.

The method 700 may include forming an electrode layer stack at least one of over or in a substrate (in 702). The electrode layer stack may include at least a first electrode layer, a second electrode layer, and an interlayer disposed between the first electrode layer and the second electrode layer.

The method 700 may include forming one or more recesses (e.g., one or more holes) into the electrode layer stack (in 704). Each recess of the one or more recesses may extend at least through the first electrode layer, the interlayer, and the second electrode layer.

According to various aspects, the electrode layer stack may include a plurality of electrode layers including the first electrode layer and the second electrode layer. The electrode layer stack may further include a plurality of interlayers including the interlayer. Each interlayer of the plurality of interlayers may be disposed between two adjacent electrode layers of the plurality of electrode layers. Each recess of the one or more recesses may extend at least through each electrode layer of the plurality of electrode layers and through each the interlayer of the plurality of interlayers.

Forming the electrode layer stack may include depositing the electrode layer stack (e.g., depositing the plurality of electrode layers and the plurality of interlayers alternatingly). An electrode layer and/or an interlayer may be deposited using any suitable deposition method, such as any physical vapor deposition method and/or any chemical vapor deposition method.

Each electrode layer of the plurality of electrode layers may include or may consist of a metal or metal alloy, such as Cu, Au, Ag, W, Al, Ru, Ti, TiN, Ta, TaN, Co, CoN, Nb, NbN, Pd, Pt, Ir, $IrO_2$, $RuO_2$, etc.

Forming the one or more recesses into the electrode layer stack may include etching one or more recesses into the electrode layer stack. Optionally, forming the one or more recesses into the electrode layer stack may further include etching the one or more recesses at least partially into the substrate. According to various aspects, etching the one or more recesses into the electrode layer stack may include forming a mask layer over the electrode layer stack. Etching the one or more recesses into the electrode layer stack may further include exposing and developing the mask layer such that one or more regions are uncovered (regions of the electrode layer stack not covered by the mask layer) and other regions (other regions of the electrode layer stack) are covered by the mask layer. Etching the one or more recesses into the electrode layer stack may further include etching a recess into the electrode layer stack in each of the one or more regions (the regions of the electrode layer stack not covered by the mask layer). Etching a recess into the electrode layer stack may include an anisotropic etching, such as plasma etching. Etching the one or more recesses into the electrode layer stack may further include removing the mask layer.

The method 700 may include partially filling the one or more recesses with a memory material, e.g., a remanent-polarizable material (in 706). The remanent-polarizable material may at least cover (e.g., partially cover, e.g., completely cover) a sidewall of each of the one or more recesses. According to various aspects, the method 700 may include a subsequent ion implantation and/or thermal annealing.

According to various aspects, partially filling the one or more recesses with a remanent-polarizable material may include a conformal deposition of the remanent-polarizable material.

According to various aspects, partially filling the one or more recesses with a remanent-polarizable material may include completely filling the one or more recesses with a remanent-polarizable material and subsequently partially etching the remanent-polarizable material.

According to various aspects, a contact (e.g., to a bottom access device) may be provided within the substrate (e.g., below the one or more recesses) and partially filling the one or more recesses with a remanent-polarizable material may include not covering the bottom surface of the one or more recesses. Partially filling the one or more recesses with a remanent-polarizable material by not covering the bottom surface of the one or more recesses may also include partially filling the one or more recesses with a remanent-polarizable material by covering bottom surface and subsequently etching the remanent-polarizable material at the bottom surface to uncover the bottom surface of the one or more recesses.

The method 700 may include at least partially filling (e.g., completely filling) a remaining space in each of the one or more recesses with an electrode material (in 708). In each of the one or more recesses, a portion of the remanent-polarizable material may be disposed between a portion of the electrode material and one of the electrode layers. The electrode material may include or may consist of a metal or metal alloy, such as Cu, Au, Ag, W, Al, Ru, Ti, TiN, Ta, TaN, Co, CoN, Nb, NbN, Pd, Pt, Ir, $IrO_2$, $RuO_2$ etc. According to various aspects, the electrode material may include or may consist of a degenerated semiconductor. At least partially filling (e.g., completely filling) the remaining space in each of the one or more recesses with the electrode material may include at least partially filling the remaining space in each of the one or more recesses with a semiconductor material and subsequently highly doping (e.g., via ion implantation and/or thermal annealing) the semiconductor material such that the semiconductor material is a degenerated semiconductor material.

According to various aspects, the method 700 may include further steps for manufacturing a memory cell arrangement 10. For example, etching or polishing electrode material and/or remanent-polarizable material over the electrode layer stack (e.g., except for electrode material and/or remanent-polarizable material disposed within the one or more recesses). For example, any kind of further step for contacting the electrode layers and/or the electrode material in the one or more recesses, for manufacturing one or more access device, and the like.

FIGS. 8A to 8F show manufacturing steps of an exemplary method 700 for manufacturing a memory cell arrangement. In the following, the method 700 is described with respect to FIGS. 8A to 8F by the way of illustration. However, it is noted that the FIGS. 8A to 8F merely provide examples of the method 700 and that the method 700 may also be implemented differently.

The method 700 may include forming an electrode layer stack 804 at least one of over or in a substrate 802. The electrode layer stack may include at least a first electrode layer 12(1), a second electrode layer 12(2), and an interlayer 806 disposed between the first electrode layer 12(1) and the second electrode layer 12(2) (see FIG. 8A).

The method 700 may include forming a mask layer 810 over the electrode layer stack 804. The method 700 may further include exposing and developing the mask layer 810 such that one or more regions are uncovered and other regions are covered by the mask layer 810 (see FIG. 8B).

Figure 8A:
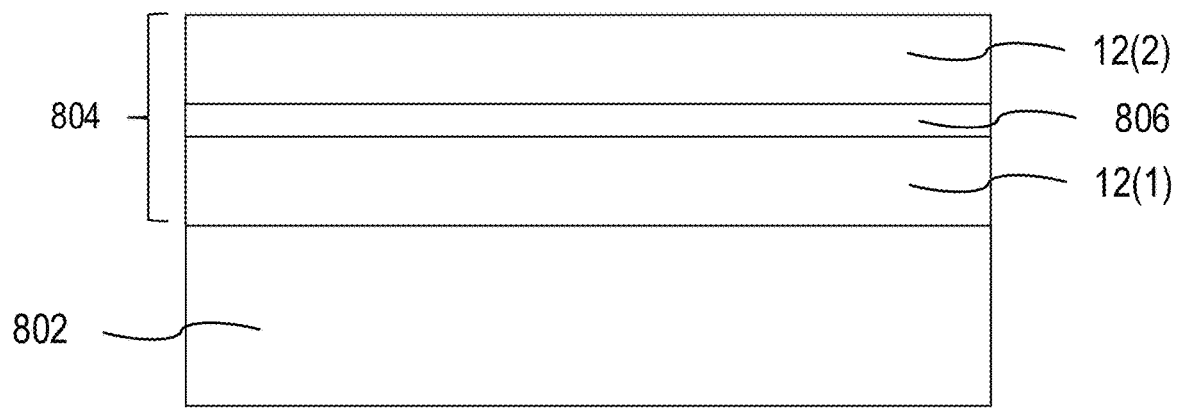
FIGS. 8A to 8F show steps of an exemplary method for manufacturing a memory cell arrangement, according to various aspects.
Figure 8B:
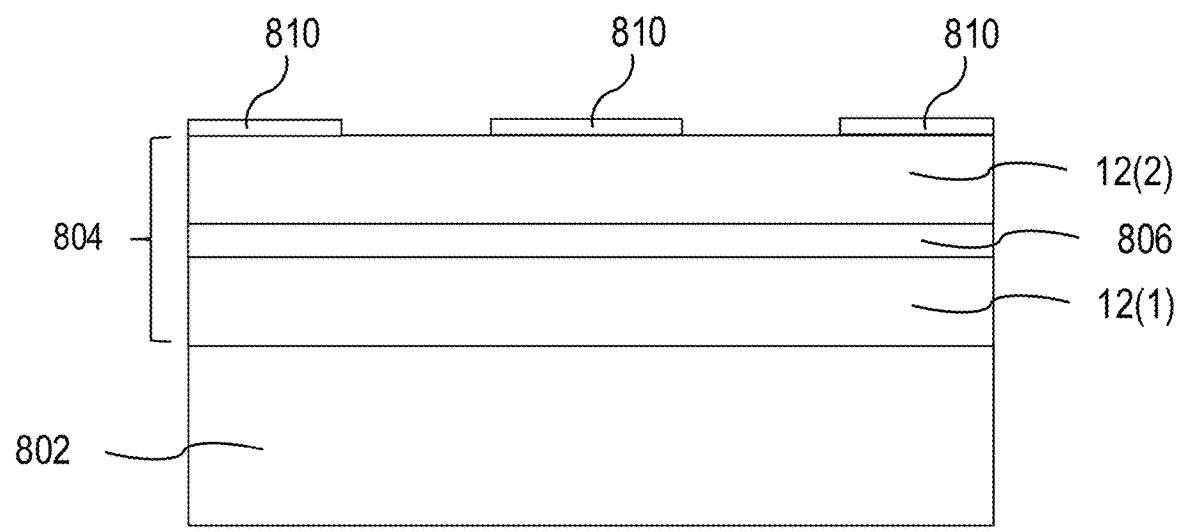
Figure 8C:
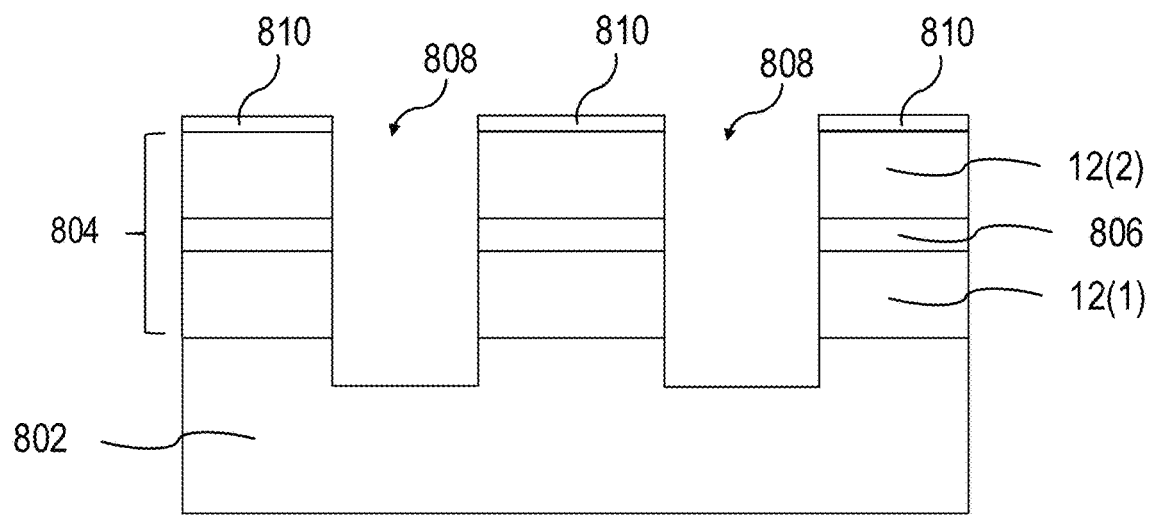
Figure 8D:
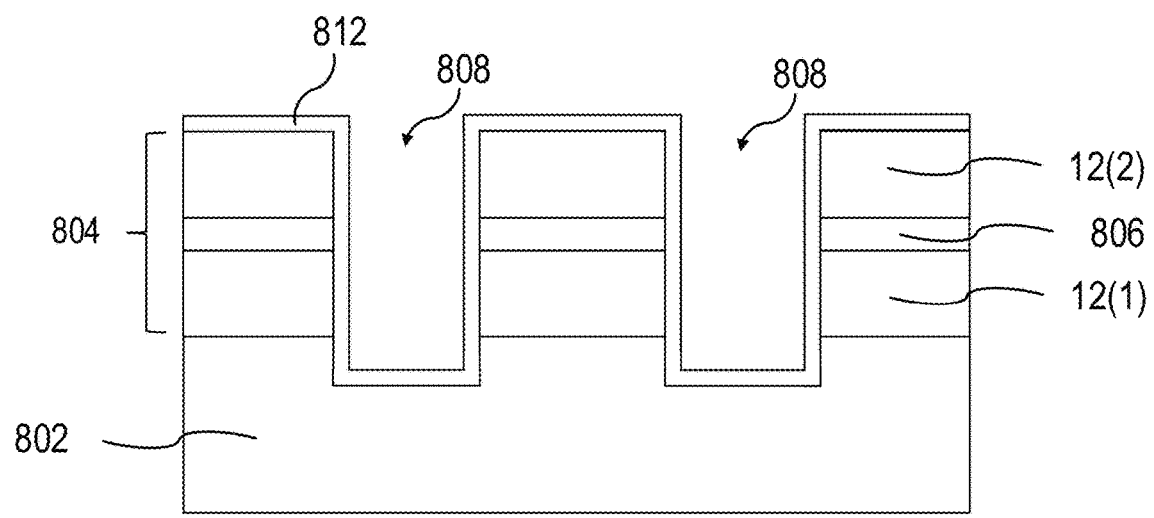

The method 700 may include etching a recess 808 into the electrode layer stack 804 (and optionally at least partially into the substrate 802) in each of the one or more regions (the regions of the electrode layer stack not covered by the mask layer) (see FIG. 8C).

The method 700 may include removing the mask layer 810. The method 700 may include partially filling the one or more recesses 808 with a remanent-polarizable material 812, for example, via a conformal deposition of the remanent-polarizable material 812 (see FIG. 8D).

Figure 8E:
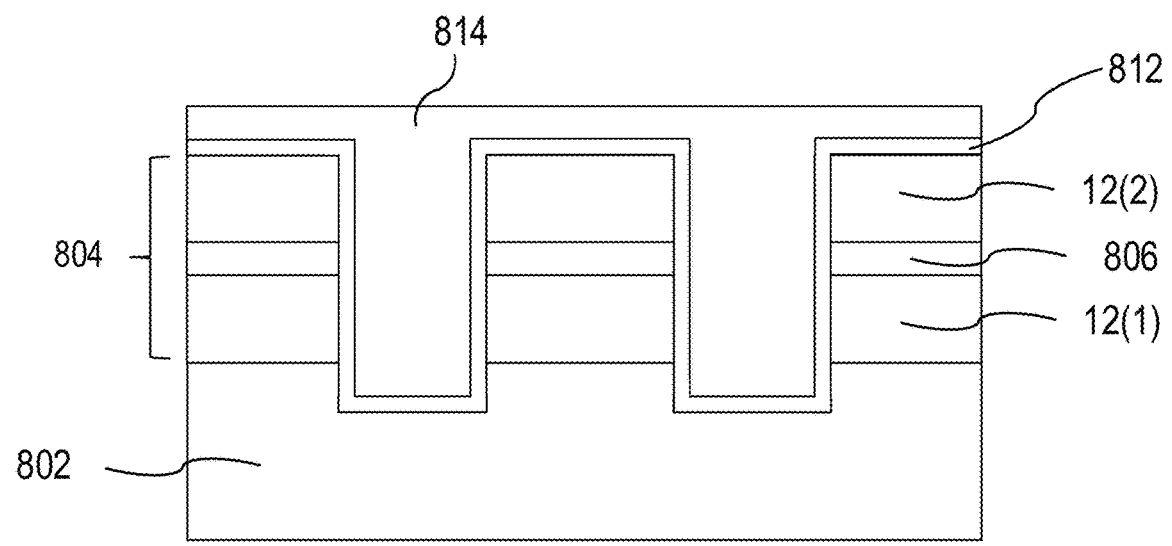
Figure 8F:
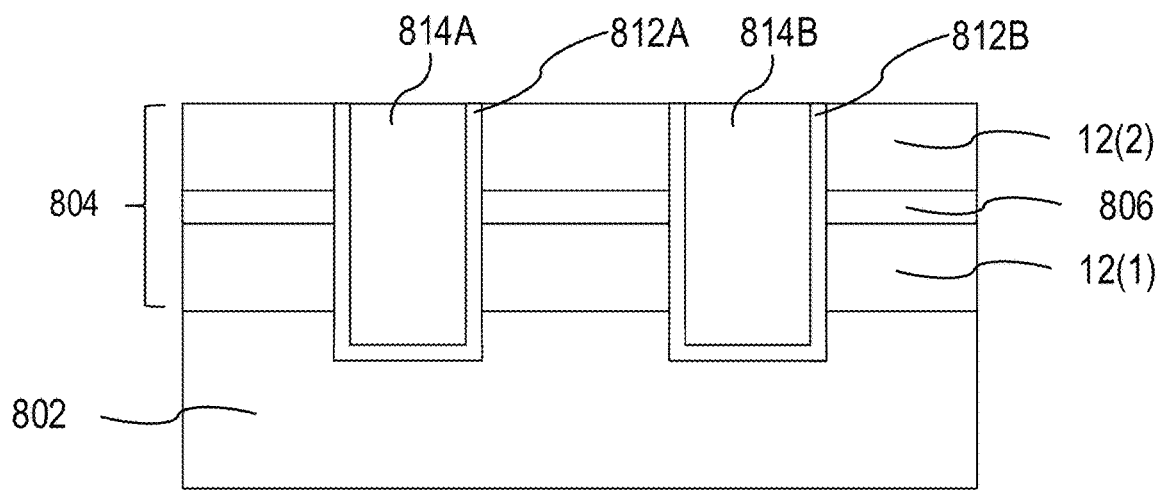

The method 700 may include at least partially filling (e.g., completely filling) a remaining space in each of the one or more recesses 808 with an electrode material 814 (see FIG. 8E).

The method 700 may include removing (e.g., etching or polishing) electrode material 814 and/or remanent-polarizable material 812 over the electrode layer stack 804 (e.g., except for electrode material 814 and/or remanent-polarizable material 812 disposed within the one or more recesses 808). According to various aspects, the electrode material 814A, 814B within a recess of the one or more recesses may provide an electrode pillar. Each electrode pillar 814A, 814B may be perimeterally surrounded (e.g., completely perimeterally surrounded) by a respective remanent-polarizable material layer 812A, 812B (see FIG. 8F).

According to various aspects, the first electrode layer 12(1), the remanent-polarizable material layer 812A, and the electrode pillar 814A may form a first memory cell. The second electrode layer 12(2), the remanent-polarizable material layer 812A, and the electrode pillar 814A may form a second memory cell. The first electrode layer 12(1), the remanent-polarizable material layer 812B, and the electrode pillar 814B may form a third memory cell. The second electrode layer 12(2), the remanent-polarizable material layer 812B, and the electrode pillar 814B may form a fourth memory cell.

In the following, various examples are provided that may include one or more aspects described above with reference to the memory cell arrangement 10, the memory cell arrangement 100, the method 60 and the method 600. It may be intended that aspects described in relation to the memory arrangement 10 or memory cell arrangement 100 may apply also to the method 600 or the method 600, and vice versa.

Example 1 is a memory cell arrangement that may include an electrode layer including at least a first through hole and a second through hole, each of the first through hole and second through hole may extend from a first surface of the electrode layer to a second surface of the electrode layer. The second surface may be opposite the first surface. The memory cell arrangement may further include a first electrode pillar, a portion of the first electrode pillar is disposed within the first through hole; a second electrode pillar, wherein a portion of the second electrode pillar is disposed within the second through hole; a first remanent-polarizable portion disposed at least within the first through hole in a first gap between the electrode layer and the portion of the first electrode pillar that is disposed within the first through hole; and a second remanent-polarizable portion disposed at least within the second through hole in a second gap between the electrode layer and the portion of the second electrode pillar that is disposed within the second through hole.

In Example 2, the subject matter of Example 1 can optionally include that electrode layer, the portion of the first electrode pillar, and the first remanent-polarizable portion may form a first memory cell; and/or that the electrode layer, the portion of the second electrode pillar, and the second remanent-polarizable portion may form a second memory cell.

Example 3 is a memory cell arrangement that may include a first electrode layer including a through hole, the through hole extending from a first surface of the first electrode layer to a second surface of the first electrode layer. The second surface may be opposite the first surface. The memory cell arrangement further includes a second electrode layer including a through hole, the through hole extending from a first surface of the second electrode layer to a second surface of the second electrode layer, the second surface is opposite the first surface; an electrode pillar, wherein a first portion of the electrode pillar is disposed within the through hole of the first electrode layer and wherein a second portion of the electrode pillar is disposed within the through hole of the second electrode layer; a first remanent-polarizable portion disposed at least within the through hole of the first electrode layer in a gap between the first electrode layer and the first portion of the electrode pillar that is disposed within the through hole of the first electrode layer; and a second remanent-polarizable portion disposed at least within the through hole of the second electrode layer in a gap between the second electrode layer and the second portion of the electrode pillar that is disposed within the through hole of the second electrode layer.

In Example 4, the subject matter of Example 3 can optionally include that the first electrode layer, the first portion of the electrode pillar, and the first remanent-polarizable portion may form a first memory cell; and/or that the second electrode layer, the second portion of the electrode pillar, and the second remanent-polarizable portion may form a second memory cell.

Example 5 is a memory cell arrangement that may include a first electrode layer including at least a first through hole and a second through hole, each of the first through hole and second through hole extending from a first surface of the first electrode layer to a second surface of the first electrode layer. The second surface may be opposite the first surface. The memory cell arrangement may further include a second electrode layer including at least a first through hole and a second through hole, each of the first through hole and second through hole extending from a first surface of the second electrode layer to a second surface of the second electrode layer, the second surface is opposite the first surface; a first electrode pillar, wherein a first portion of the first electrode pillar is disposed within the first through hole of the first electrode layer and wherein a second portion of the first electrode pillar is disposed within the first through hole of the second electrode layer; a second electrode pillar, wherein a first portion of the second electrode pillar is disposed within the second through hole of the first electrode layer and wherein a second portion of the second electrode pillar is disposed within the second through hole of the second electrode layer; a first remanent-polarizable portion disposed at least within the first through hole of the first electrode layer in a gap between the first electrode layer and the first portion of the first electrode pillar that is disposed within the first through hole of the first electrode layer; a second remanent-polarizable portion disposed at least within the first through hole of the second electrode layer in a gap between the second electrode layer and the second portion of the first electrode pillar that is disposed within the first through hole of the second electrode layer; a third remanent-polarizable portion disposed at least within the second through hole of the first electrode layer in a gap between the first electrode layer and the first portion of the second electrode pillar that is disposed within the second through hole of the first electrode layer; and a fourth remanent-polarizable portion disposed at least within the second through hole of the second electrode layer in a gap between the second electrode layer and the second portion of the second electrode pillar that is disposed within the second through hole of the second electrode layer. In Example 6, the subject matter of Example 5 can optionally include that the first electrode layer, the first portion of the first electrode pillar, and the first remanent-polarizable portion form a first memory cell; that the second electrode layer, the second portion of the first electrode pillar, and the second remanent-polarizable portion form a second memory cell; that the first electrode layer, the first portion of the second electrode pillar, and the third remanent-polarizable portion form a third memory cell; and/or that the second electrode layer, the second portion of the second electrode pillar, and the fourth remanent-polarizable portion form a fourth memory cell.

Example 7 is a memory cell arrangement that may include a plurality of electrode layers, each of the plurality of electrode layers includes a plurality of through holes, each through hole of the plurality of through holes may extend from a first surface of the respective electrode layer to a second surface of the electrode layer. The second surface may be opposite the first surface. The memory cell arrangement may further include a plurality of electrode pillars, wherein each electrode pillar of the plurality of electrode pillars includes a plurality of electrode portions, wherein each of the plurality of electrode portions is disposed within a corresponding through hole of the plurality through holes; wherein at least one remanent-polarizable portion is disposed in each through hole of the plurality of through holes in a gap between the respective electrode layer and the respective electrode portion.

In Example 8, the subject matter of Example 7 can optionally include that, for each of the through holes, the corresponding electrode portion, the corresponding electrode layer, and the corresponding remanent-polarizable portion may form a memory cell of a plurality of memory cells.

Example 9 is a memory cell arrangement that may include an electrode layer including at least a first through hole and a second through hole, each of the first through hole and second through hole extending from a first surface of the electrode layer to a second surface of the electrode layer. The second surface may be opposite the first surface. The memory cell arrangement may further include a first electrode pillar, a portion of the first electrode pillar is disposed within the first through hole; a second electrode pillar, wherein a portion of the second electrode pillar is disposed within the second through hole; a first memory material portion disposed at least within the first through hole in a first gap between the electrode layer and the portion of the first electrode pillar that is disposed within the first through hole; and a second memory material portion disposed at least within the second through hole in a second gap between the electrode layer and the portion of the second electrode pillar that is disposed within the second through hole.

In Example 10, the subject matter of Example 9 can optionally include that the electrode layer, the first electrode pillar, and the first memory material portion may form a first memory cell; and/or that the electrode layer, the second electrode pillar, and the memory material portion may form a second memory cell.

Example 11 is a memory cell arrangement that may include a first electrode layer including a through hole, the through hole extending from a first surface of the first electrode layer to a second surface of the first electrode layer. The second surface may be opposite the first surface. The memory cell arrangement further includes a second electrode layer including a through hole, the through hole extending from a first surface of the second electrode layer to a second surface of the second electrode layer, the second surface is opposite the first surface; an electrode pillar, wherein a first portion of the electrode pillar is disposed within the through hole of the first electrode layer and wherein a second portion of the electrode pillar is disposed within the through hole of the second electrode layer; a first memory material portion disposed at least within the through hole of the first electrode layer in a gap between the first electrode layer and the first portion of the electrode pillar that is disposed within the through hole of the first electrode layer; and a second memory material portion disposed at least within the through hole of the second electrode layer in a gap between the second electrode layer and the second portion of the electrode pillar that is disposed within the through hole of the second electrode layer.

In Example 12, the subject matter of Example 11 can optionally include that the first electrode layer, the first portion of the electrode pillar, and the first memory material portion may form a first memory cell; and/or that the second electrode layer, the second portion of the electrode pillar, and the second memory material portion may form a second memory cell.

Example 13 is a memory cell arrangement that may include a first electrode layer including at least a first through hole and a second through hole, each of the first through hole and second through hole extending from a first surface of the first electrode layer to a second surface of the first electrode layer. The second surface may be opposite the first surface. The memory cell arrangement may further include a second electrode layer including at least a first through hole and a second through hole, each of the first through hole and second through hole extending from a first surface of the second electrode layer to a second surface of the second electrode layer, the second surface is opposite the first surface; a first electrode pillar, wherein a first portion of the first electrode pillar is disposed within the first through hole of the first electrode layer and wherein a second portion of the first electrode pillar is disposed within the first through hole of the second electrode layer; a second electrode pillar, wherein a first portion of the second electrode pillar is disposed within the second through hole of the first electrode layer and wherein a second portion of the second electrode pillar is disposed within the second through hole of the second electrode layer; a first memory material portion disposed at least within the first through hole of the first electrode layer in a gap between the first electrode layer and the first portion of the first electrode pillar that is disposed within the first through hole of the first electrode layer; a second memory material portion disposed at least within the first through hole of the second electrode layer in a gap between the second electrode layer and the second portion of the first electrode pillar that is disposed within the first through hole of the second electrode layer; a third memory material portion disposed at least within the second through hole of the first electrode layer in a gap between the first electrode layer and the first portion of the second electrode pillar that is disposed within the second through hole of the first electrode layer; and a fourth memory material portion disposed at least within the second through hole of the second electrode layer in a gap between the second electrode layer and the second portion of the second electrode pillar that is disposed within the second through hole of the second electrode layer.

In Example 14, the subject matter of Example 13 can optionally include that the first electrode layer, the first portion of the first electrode pillar, and the first memory material portion may form a first memory cell; that the second electrode layer, the second portion of the first electrode pillar, and the second memory material portion may form a second memory cell; that the first electrode layer, the first portion of the second electrode pillar, and the third memory material portion may form a third memory cell; and/or that the second electrode layer, the second portion of the second electrode pillar, and the fourth memory material portion may form a fourth memory cell.

Example 15 is a memory cell arrangement that may include a plurality of electrode layers, each of the plurality of electrode layers includes a plurality of through holes, each through hole of the plurality of through holes extending from a first surface of the respective electrode layer to a second surface of the electrode layer. The second surface may be opposite the first surface. The memory cell arrangement may further include a plurality of electrode pillars, wherein each electrode pillar of the plurality of electrode pillars includes a plurality of electrode portions, wherein each of the plurality of electrode portions is disposed within a corresponding through hole of the plurality through holes; wherein at least one memory material portion is disposed in each through hole of the plurality of through holes in a gap between the respective electrode layer and the respective electrode portion.

In Example 16, the subject matter of Example 15 can optionally include that, for each of the through holes, the corresponding electrode portion, the corresponding electrode layer, and the corresponding memory material portion may form a memory cell of a plurality of memory cells.

In Example 17, the subject matter of any one of Examples 9 to 16 can optionally include that each memory material portion (the first memory material portion, the second memory material portion, third memory material portion, and fourth memory material portion or the plurality of material portions) includes a phase-change material portion.

In Example 18, the subject matter of any one of Examples 9 to 16 can optionally include that each memory material portion (the first memory material portion, the second memory material portion, third memory material portion, and fourth memory material portion, or the plurality of material portion) includes a remanent-polarizable portion.

In Example 19, the subject matter of any one of Examples 1 to 8 or Example 18 can optionally include that each remanent-polarizable portion (the first remanent-polarizable portion, the second remanent-polarizable portion, the third remanent-polarizable portion, the fourth remanent-polarizable portion, and each of the plurality of remanent-polarizable portions) surrounds (e.g., perimeterally surrounds) the respective electrode pillar and/or electrode pillar portion (the electrode pillar, the first electrode pillar, the second electrode pillar, the first portion of the first electrode pillar, the second portion of the first electrode pillar, the first portion of the second electrode pillar, the second portion of the second electrode pillar, or a corresponding portion of an electrode pillar of the plurality of electrode pillars), wherein preferably each remanent-polarizable portion completely perimeterally surrounds the respective electrode pillar.

In Example 20, the subject matter of any one of Examples 1 to 8 or Example 18 or 19 can optionally include that each remanent-polarizable portion (the first remanent-polarizable portion, the second remanent-polarizable portion, the third remanent-polarizable portion, and the fourth remanent-polarizable portion) completely fills the gap between the corresponding electrode layer (of the electrode layer, the first electrode layer, the second electrode layer, or the plurality of electrode layers) and the corresponding electrode pillar or the corresponding electrode pillar portion (of the electrode pillar, the first electrode pillar, the second electrode pillar, the first portion of the first electrode pillar, the second portion of the first electrode pillar, the first portion of the second electrode pillar, the second portion of the second electrode pillar, or a portion of an electrode pillar of the plurality of electrode pillars). In Example 21, the subject matter of any one of Examples 1 to 8 or any one of Examples 18 to 20 can optionally include that each remanent-polarizable portion (the first remanent-polarizable portion, the second remanent-polarizable portion, the third remanent-polarizable portion, and the fourth remanent-polarizable portion) is configured to be switchable from a first polarization state with a first residual polarization to a second polarization state with a second residual polarization.

In Example 22, the subject matter of Example 21 can optionally include that an absolute value of a first residual polarization of the remanent-polarizable layer associated with the first polarization state is substantially equal to an absolute value of a second residual polarization of the remanent-polarizable layer associated with the second polarization state.

In Example 23, the subject matter of any one of Examples 1 to 8 or any one of Examples 18 to 22 can optionally include that each remanent-polarizable portion (the first remanent-polarizable portion, the second remanent-polarizable portion, the third remanent-polarizable portion, and the fourth remanent-polarizable portion) includes or consists of a ferroelectric material, preferably ferroelectric hafnium oxide, ferroelectric zirconium oxide, or a mixture of hafnium oxide and zirconium oxide.

In Example 24, the subject matter of any one of Examples 1 to 8 or any one of Examples 18 to 23 can optionally include that the memory cell arrangement further includes a respective substantially continuous remanent-polarizable layer perimeterally surrounds, preferably completely perimeterally surrounds each of the electrode pillars (a first substantially continuous remanent-polarizable layer perimeterally surrounds the first electrode pillar, a second substantially continuous remanent-polarizable layer perimeterally surrounds the second electrode pillar, etc.), the respective substantially continuous remanent-polarizable layer provides the remanent-polarizable portions (e.g., the first substantially continuous remanent-polarizable layer forms the first and second remanent-polarizable portions, e.g., the second substantially continuous remanent-polarizable layer forms the third and fourth remanent-polarizable portions) associated with the corresponding electrode pillar.

In Example 25, the subject matter of Example 24 can optionally include that each remanent-polarizable layer perimeterally surrounds the respective electrode pillar.

In Example 26, the subject matter of Example 24 or 25 can optionally include that each remanent-polarizable layer includes or consists of a ferroelectric material, preferably ferroelectric hafnium oxide.

In Example 27, the subject matter of any one of Examples 1 to 26 can optionally include that none of the electrode layers (of the electrode layer, the first electrode layer, the second electrode layer, or the plurality of electrode layers) directly contacts any one of the electrode pillars or electrode pillar portions (of the electrode pillar, the first electrode pillar, the second electrode pillar, the first portion of the first electrode pillar, the second portion of the first electrode pillar, the first portion of the second electrode pillar, or the second portion of the second electrode pillar, or a portion of an electrode pillar of the plurality of electrode pillars).

In Example 28, the subject matter of any one of Examples 1 to 26 can optionally include that all of the electrode pillars are physically separated (and/or electrically isolated) from all of the electrode layers.

In Example 29, the subject matter of any one of Examples 1 to 28 can optionally include that all of the electrode layers are physically separated (and/or electrically isolated) from one another, and/or all of the electrode pillars are physically separated (and/or electrically isolated) from one another.

In Example 30, the subject matter of any one of Examples 1 to 29 can optionally include that the memory cell arrangement further includes at least one interlayer disposed between two adjacent electrode layers of the plurality of electrode layers (of the first electrode layer, the second electrode layer, or the plurality of electrode layers).

In Example 31, the subject matter of Example 30 can optionally include that the interlayer is configured to electrically decouple the two adjacent electrode layers from each other.

In Example 32, the subject matter of Example 30 or 31 can optionally include that the interlayer includes electrically insulating material.

In Example 33, the subject matter of any one of Examples 1 to 32 can optionally include that each of the electrode layers (of the electrode layer, the first electrode layer, the second electrode layer, or the plurality of electrode layers) has a plate shape.

In Example 34, the subject matter of any one of Examples 1 to 33 can optionally include that each of the electrode pillars (the electrode pillar, the first electrode pillar, the second electrode pillar, the plurality of electrode pillars) has a pillar shape with a base geometry of one of the following: a circle, a triangle, a square, a parallelogram, a trapezoid, an ellipse, a polygon, etc.

In Example 35, the subject matter of any one of Examples 1 to 34 can optionally include that each electrode pillar (the electrode pillar, the first electrode pillar, the second electrode pillar, the plurality of electrode pillars) is coupled (e.g., electrically conductively connected) to a corresponding access device. For example, an access device may be configured to allow for a selective access of memory cells corresponding to the electrode pillar during a read operation and/or a write operation.

In Example 36, the subject matter of Example 35 can optionally include that each access device includes a transmission gate or a transistor, preferably a field-effect transistor.

In Example 37, the subject matter of Example 35 or 36 can optionally include that each access device is configured to connect a corresponding first control line of a plurality of first control lines to the corresponding electrode pillar controlled by a voltage applied at a corresponding second control line of a plurality of second control lines.

In Example 38, the subject matter of any one of Examples 1 to 37 can optionally include that each electrode layer (the electrode layer, the first electrode layer, the second electrode layer, the plurality of electrode layers) is connected (e.g., electrically conductively connected) to a corresponding third control line of a plurality of third control lines, and/or each electrode layer forms at least part of a corresponding third control line.

In Example 39, the subject matter of any one of Examples 1 to 38 can optionally include that each electrode pillar (the electrode pillar, the first electrode pillar, the second electrode pillar, the plurality of electrode pillars) is connected (e.g., electrically conductively connected) to a corresponding fourth control line of a plurality of fourth control lines, and/or wherein each electrode pillar (the electrode pillar, the first electrode pillar, the second electrode pillar, the plurality of electrode pillars) forms at least part of a corresponding fourth control line.

In Example 40, the subject matter of Examples 2, 4, 6, 8, 10, 12 or 14 and Examples 38 and 39 can optionally include that each memory cell (the first memory cell, the second memory cell, the third memory cell, the fourth memory cell, the plurality of memory cells) is associated with a corresponding third control line of the plurality of third control lines and a corresponding fourth control line of the plurality of fourth control lines, and addressable via the fourth control line corresponding to the electrode pillar of a respective memory cell and the third control line corresponding to the electrode layer of the memory cell.

In Example 41, the subject matter of Examples 2, 4, 6, 8, 10, 12, 14 or 40 can optionally include that each memory cell (the first memory cell, the second memory cell, the third memory cell, the fourth memory cell, the plurality of memory cells) includes a remanent-polarizable capacitor (e.g., a ferroelectric capacitor).

In Example 42, the subject matter of any one of Examples 35 to 37 and any one of Examples 39 to 41 can optionally include that each electrode pillar (the electrode pillar, the first electrode pillar, the second electrode pillar, the plurality of electrode pillars) is coupled to the corresponding access device via the corresponding fourth control line.

In Example 43, the subject matter of any one of Examples 1 to 42 can optionally include that the memory cell arrangement further includes a control circuit, configured to address (e.g. to program, erase, or read out) one of the memory cells (the first memory cell, the second memory cell, the third memory cell, the fourth memory cell, or one of the plurality of memory cells).

In Example 44, the subject matter of Example 43 can optionally include that the memory cell to be addressed has a bitline, a wordline, and an electrode layer (of the electrode layer, the first electrode layer, the second electrode layer, or one of the plurality of electrode layers) associated therewith, and that the control circuit is configured to address the memory cell to be addressed by supplying (e.g., applying) a first voltage to the associated bitline, a second voltage to the associated wordline, and a third voltage to the associated electrode layer. Example 45 is a memory cell arrangement that may include a first electrode layer including at least a first through hole, a second through hole, a third through hole, and a fourth through hole, each of the first through hole, the second through hole, the third through hole, and the fourth through hole may extend from a first surface of the first electrode layer to a second surface of the first electrode layer. The second surface may be opposite the first surface. The memory cell arrangement may further include a second electrode layer including at least a first through hole, a second through hole, a third through hole, and a fourth through hole, each of the first through hole, the second through hole, the third through hole, and the fourth through hole extending from a first surface of the second electrode layer to a second surface of the second electrode layer, the second surface is opposite the first surface; a first electrode pillar, wherein a first portion of the first electrode pillar is disposed within the first through hole of the first electrode layer and wherein a second portion of the first electrode pillar is disposed within the first through hole of the second electrode layer; a second electrode pillar, wherein a first portion of the second electrode pillar is disposed within the second through hole of the first electrode layer and wherein a second portion of the second electrode pillar is disposed within the second through hole of the second electrode layer; a third electrode pillar, wherein a first portion of the third electrode pillar is disposed within the third through hole of the first electrode layer and wherein a second portion of the third electrode pillar is disposed within the third through hole of the second electrode layer; a fourth electrode pillar, wherein a first portion of the fourth electrode pillar is disposed within the fourth through hole of the first electrode layer and wherein a second portion of the fourth electrode pillar is disposed within the fourth through hole of the second electrode layer; a first remanent-polarizable portion disposed at least within the first through hole of the first electrode layer in a gap between the first electrode layer and the first portion of the first electrode pillar that is disposed within the first through hole of the first electrode layer; a second remanent-polarizable portion disposed at least within the first through hole of the second electrode layer in a gap between the second electrode layer and the second portion of the first electrode pillar that is disposed within the first through hole of the second electrode layer; a third remanent-polarizable portion disposed at least within the second through hole of the first electrode layer in a gap between the first electrode layer and the first portion of the second electrode pillar that is disposed within the second through hole of the first electrode layer; and a fourth remanent-polarizable portion disposed at least within the second through hole of the second electrode layer in a gap between the second electrode layer and the second portion of the second electrode pillar that is disposed within the second through hole of the second electrode layer; a fifth remanent-polarizable portion disposed at least within the third through hole of the first electrode layer in a gap between the first electrode layer and the first portion of the third electrode pillar that is disposed within the third through hole of the first electrode layer; a sixth remanent-polarizable portion disposed at least within the third through hole of the second electrode layer in a gap between the second electrode layer and the second portion of the third electrode pillar that is disposed within the third through hole of the second electrode layer; a seventh remanent-polarizable portion disposed at least within the fourth through hole of the first electrode layer in a gap between the first electrode layer and the first portion of the fourth electrode pillar that is disposed within the fourth through hole of the first electrode layer; an eighth remanent-polarizable portion disposed at least within the fourth through hole of the second electrode layer in a gap between the second electrode layer and the second portion of the fourth electrode pillar that is disposed within the fourth through hole of the second electrode layer; wherein the first electrode layer, the first portion of the first electrode pillar, and the first remanent-polarizable portion form a first memory cell; wherein the second electrode layer, the second portion of the first electrode pillar, and the second remanent-polarizable portion form a second memory cell; wherein the first electrode layer, the first portion of the second electrode pillar, and the third remanent-polarizable portion form a third memory cell; wherein the second electrode layer, the second portion of the second electrode pillar, and the fourth remanent-polarizable portion form a fourth memory cell; wherein the first electrode layer, the first portion of the third electrode pillar, and the fifth remanent-polarizable portion form a fifth memory cell; wherein the second electrode layer, the second portion of the third electrode pillar, and the sixth remanent-polarizable portion form a sixth memory cell; wherein the first electrode layer, the first portion of the fourth electrode pillar, and the seventh remanent-polarizable portion form a seventh memory cell; wherein the second electrode layer, the second portion of the fourth electrode pillar, and the eighth remanent-polarizable portion form an eighth memory cell; a first access device configured to connect a first bitline to the first electrode pillar controlled by a voltage applied at a first wordline; a second access device configured to connect the first bitline to the second electrode pillar controlled by a voltage applied at a second wordline; a third access device configured to connect a second bitline to the third electrode pillar controlled by a voltage applied at the first wordline; a fourth access device configured to connect the second bitline to the fourth electrode pillar controlled by a voltage applied at the second wordline; a control circuit configured to address one of the first memory cell, the second memory cell, the third memory cell, the fourth memory cell, the fifth memory cell, the sixth memory cell, the seventh memory cell, or the eighth memory cell by supplying a first voltage to the associated one of the first bitline or the second bitline, a second voltage to the associated one of the first wordline or the second wordline, and a third voltage to the associated one of the first electrode layer or the second electrode layer.

In Example 46, the subject matter of any one of Examples 1 to 45 can optionally include that each of the electrode layers includes or consists of a metal or metal alloy (e.g., Cu, Au, Ag, W, Al, Ru, Ti, TiN, Ta, TaN, Co, CoN, Nb, NbN, Pd, Pt, Ir, $IrO_2$, $RuO_2$, etc.) and/or that each of the electrode layers includes or consists of a degenerated semiconductor.

In Example 47, the subject matter of any one of Examples 1 to 46 can optionally include that each of the electrode pillars includes or consists of a metal or metal alloy (e.g., Cu, Au, Ag, W, Al, Ru, Ti, TiN, Ta, TaN, Co, CoN, Nb, NbN, Pd, Pt, Ir, $IrO_2$, $RuO_2$, etc.) and/or that each of the electrode pillars includes or consists of a degenerated semiconductor.

Example 48 is a method for operating a memory cell arrangement that may include: supplying a voltage to an electrode pillar associated with a memory cell to be addressed selected from a plurality of memory cells via an access device corresponding to the electrode pillar, other memory cells of the plurality of memory cells are not addressed, and supplying a voltage to an electrode layer associated with the memory cell to be addressed.

In Example 49, the subject matter of Example 48 can optionally include that supplying the voltage to the electrode pillar includes supplying the voltage to a corresponding first control line of a plurality of first control lines corresponding to the access device, and supplying a third voltage to a third control line corresponding to the access device to connect the corresponding first control line to the electrode pillar.

Example 50 is a method for manufacturing a memory cell arrangement that may include: forming an electrode layer stack at least one of over or in a substrate. The electrode layer stack includes at least a first electrode layer, a second electrode layer, and an interlayer disposed between the first electrode layer and the second electrode layer. The method further includes forming one or more recesses (e.g., one or more holes) into the electrode layer stack, the one or more recesses extend at least through the first electrode layer, the interlayer, and the second electrode layer, partially filling the one or more recesses with a remanent-polarizable material, the remanent-polarizable material at least covering (at least partially or completely) a sidewall of each of the one or more recesses; and, subsequently, at least partially filling a remaining space in each of the one or more recesses with an electrode material, wherein, in each of the one or more recesses, a portion of the remanent-polarizable material is disposed between a portion of the electrode material and one of the electrode layers.

In Example 51, the subject matter of Example 50 can optionally include that the electrode layer stack includes a plurality of electrode layers including the first electrode layer and the second electrode layer, and a plurality of interlayers including the interlayer, each interlayer of the plurality of interlayers disposed between two adjacent electrode layers of the plurality of electrode layers, and wherein the one or more recesses extend at least through each of the plurality of electrode layers and each of the plurality of interlayers.

In Example 52, the subject matter of Example 50 or 51 can optionally include that forming the electrode layer stack includes depositing the electrode layer stack (e.g., depositing the electrode layers and the one or more interlayers alternatingly).

In Example 53, the subject matter of any one of Examples 50 to 52 can optionally include that forming one or more recesses into the electrode layer stack includes etching one or more recesses into the electrode layer stack and optionally further at least partially into the substrate.

In Example 54, the subject matter of Example 53 can optionally include that forming one or more recesses into the electrode layer stack includes: forming a mask layer over the electrode layer stack, exposing and developing the mask layer such that one or more regions are uncovered and other regions are covered by the mask layer; etching a recess into the electrode layer stack in each of the one or more regions; and removing the mask layer.

In Example 55, the subject matter of Example 54 can optionally include that etching a recess into the electrode layer stack includes an anisotropic etching (e.g., plasma etching).

In Example 56, the subject matter of any one of Examples 50 to 55 can optionally include that partially filling the one or more recesses with the remanent-polarizable material includes conformally depositing the remanent-polarizable material.

In Example 57, the subject matter of any one of Examples 50 to 55 can optionally include that partially filling the one or more recesses with the remanent-polarizable material includes completely filling the one or more recesses with the remanent-polarizable material and subsequently partially etching the remanent-polarizable material.

In Example 58, the subject matter of any one of Examples 50 to 57 can optionally include that at least partially filling the remaining space in each of the one or more recesses with the electrode material includes completely filling the remaining space in each of the one or more recesses with the electrode material.

In Example 59, the subject matter of any one of Examples 50 to 58 can optionally include that the electrode material includes a metal or metal alloy (e.g., Cu, Au, Ag, W, Al, Ru, Ti, TiN, Ta, TaN, Co, CoN, Nb, NbN, Pd, Pt, Ir, $IrO_2$, $RuO_2$, etc.) and/or a degenerated semiconductor.

It is noted that one or more functions described herein with reference to a memory cell, a remanent-polarizable portion, a memory cell arrangement, etc., may be accordingly part of a method, e.g., part of a method for operating a memory cell arrangement. Vice versa, one or more functions described herein with reference to a method, e.g., with reference to a method for operating a memory cell arrangement, may be implemented accordingly in a device or in a part of a device, for example, in a remanent-polarizable portion, a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. Memory cell arrangement, comprising:
a plurality of electrode layers, wherein each of the plurality of electrode layers comprises a plurality of through holes, each through hole of the plurality of through holes extending from a first surface of a respective electrode layer to a second surface of the respective electrode layer, wherein the second surface is opposite the first surface; and
a plurality of electrode pillars, wherein each electrode pillar of the plurality of electrode pillars comprises a plurality of electrode portions, wherein each of the plurality of electrode portions is disposed within a corresponding through hole of the plurality of through holes;
wherein the respective electrode layer and a respective electrode portion of the plurality of electrode portions form a first electrode and a second electrode of a capacitor and wherein at least one memory material portion is disposed in each through hole of the plurality of through holes in a gap between the respective electrode layer and the respective electrode portion.

2. Memory cell arrangement of claim 1,
wherein an electrode portion, an electrode layer, and at least one memory material portion, of a plurality of memory material portions, associated with one of the plurality of through holes form a capacitor-based memory cell of a plurality of capacitor-based memory cells.

3. Memory cell arrangement of claim 2,
wherein each memory material portion of the plurality of memory material portions surrounds the respective electrode pillar portion of a plurality of electrode pillar portions.

4. Memory cell arrangement of claim 3,
wherein each memory material portion completely perimeterally surrounds the respective electrode pillar portion.

5. Memory cell arrangement of claim 3,
wherein each memory material portion of the plurality of memory material portions completely fills the gap between the corresponding electrode layer and the corresponding electrode pillar portion.

6. Memory cell arrangement of claim 2,
wherein each memory material portion of the plurality of memory material portions is polarizable.

7. Memory cell arrangement of claim 2,
wherein each memory material portion of the plurality of memory material portions is spontaneously polarizable.

8. Memory cell arrangement of claim 2, further comprising:
wherein a respective substantially continuous memory material layer perimeterally surrounds each electrode pillar of the plurality of electrode pillars, the respective substantially continuous memory material layer provides the plurality of memory material portions associated with the corresponding electrode pillar.

9. Memory cell arrangement of claim 1,
wherein all of the plurality of electrode layers are spaced apart from one another; and/or
wherein all of the plurality of electrode pillars are spaced apart from one another.

10. Memory cell arrangement of claim 1,
further comprising at least one interlayer disposed between two adjacent electrode layers of the plurality of electrode layers.

11. Memory cell arrangement of claim 1,
wherein each electrode pillar of the plurality of electrode pillars is electrically conductively connected to a corresponding access device to allow for a selective access of capacitor-based memory cells corresponding to the electrode pillar during a read operation and/or a write operation.

12. Memory cell arrangement of claim 1,
wherein each electrode layer is electrically conductively connected to a corresponding control line of a plurality of control lines to allow for a selective access of capacitor-based memory cells corresponding to the electrode layer during a read operation and/or a write operation; or
wherein each electrode layer forms at least part of a corresponding control line.

13. Memory cell arrangement of claim 1,
wherein each electrode pillar of the plurality of electrode pillars is electrically conductively connected to a corresponding control line of a plurality of control lines to allow for a selective access of capacitor-based memory cells corresponding to the electrode pillar during a read operation and/or a write operation; or
wherein each electrode pillar forms at least part of a corresponding control line.

14. Memory cell arrangement of claim 1,
wherein each electrode layer of the plurality of electrode layers comprises or consists of a metal or metal alloy, or wherein each electrode pillar of the plurality of electrode pillars comprises or consists of a metal or metal alloy.

15. Memory cell arrangement of claim 1,
wherein the at least one memory material portion that is disposed in a respective through hole of the plurality of through holes directly contacts the respective electrode portion of the respective electrode pillar disposed within the through hole; or
wherein the at least one memory material portion disposed in a respective through hole of the plurality of through holes directly contacts the electrode layer associated with the respective through hole.

16. Memory cell arrangement of claim 1, further comprising:
a substrate, wherein the plurality of electrode layers is disposed at least one of over or on a surface of the substrate:
wherein each of the plurality of electrode layers extends parallel to the surface of the substrate.

17. Memory cell arrangement of claim 16,
wherein each electrode pillar of the plurality of electrode pillars extends substantially perpendicular to the surface of the substrate.

18. Memory cell arrangement of claim 16,
wherein at least two electrode layers of the plurality of electrode layers have a respective lateral dimension being different from one another.

19. Method of operating a memory cell arrangement, the method comprising:
supplying a voltage to an electrode pillar associated with a memory cell to be addressed selected from a plurality of memory cells via an access device corresponding to the electrode pillar by supplying a first voltage to a first control line associated with the memory cell to be addressed and by supplying a second voltage to a second control line associated with the memory cell to be addressed, wherein other memory cells of the plurality of memory cells are not addressed;
supplying a voltage to an electrode layer associated with the memory cell to be addressed by supplying a third voltage to a third control line corresponding to the electrode layer;
supplying a first inhibit voltage to one or more first control lines of a plurality of first control lines not corresponding to the memory cell to be addressed;
supplying a second inhibit voltage to one or more second control lines of a plurality of second control lines not corresponding to the memory cell to be addressed; and
supplying a third inhibit voltage to one or more third control lines of a plurality of third control lines not corresponding to the memory cell to be addressed, wherein the third inhibit voltage is configured to prohibit that one or more memory cells not to be addressed change into another one of at least two memory states of the respective memory cell.

* * * * *